(12) United States Patent
Yang

(10) Patent No.: US 11,948,990 B2
(45) Date of Patent: *Apr. 2, 2024

(54) MANUFACTURING METHOD OF SEMICONDUCTOR DEVICE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/990,749

(22) Filed: Nov. 21, 2022

(65) Prior Publication Data

US 2023/0079155 A1   Mar. 16, 2023

Related U.S. Application Data

(63) Continuation of application No. 17/163,589, filed on Feb. 1, 2021, now Pat. No. 11,538,915.

(30) Foreign Application Priority Data

Jan. 11, 2021   (CN) .......................... 202110030120.6

(51) Int. Cl.
   *H01L 29/423* (2006.01)
   *H01L 27/092* (2006.01)
   *H01L 29/786* (2006.01)
(52) U.S. Cl.
   CPC ...... *H01L 29/42392* (2013.01); *H01L 27/092* (2013.01); *H01L 29/78696* (2013.01)

(58) Field of Classification Search
   CPC ............ H01L 29/42392; H01L 27/092; H01L 29/78696; H01L 21/8221; H01L 21/823807; H01L 27/0688; H01L 29/0673; H01L 21/82385; H01L 29/66439; H01L 29/775; H01L 29/7853; H01L 29/785; H01L 27/0886; H01L 29/42356; B82Y 10/00
   USPC ...................................................... 257/401
   See application file for complete search history.

(56) References Cited

U.S. PATENT DOCUMENTS

| 9,461,114 | B2 | 10/2016 | Obradovic |
| 11,538,915 | B2 * | 12/2022 | Yang .................. H01L 29/7853 |
| 2017/0018462 | A1 | 1/2017 | Suk |
| 2020/0098642 | A1 | 3/2020 | Bi |

(Continued)

*Primary Examiner* — Tong-Ho Kim
(74) *Attorney, Agent, or Firm* — Winston Hsu

(57) ABSTRACT

A manufacturing method of a semiconductor device includes the following steps. A first transistor is formed on a substrate. The first transistor includes a first semiconductor channel structure and two first source/drain structures. The first semiconductor channel structure includes first horizontal portions and a first vertical portion. The first horizontal portions are stacked in a vertical direction and separated from one another. Each of the first horizontal portions is elongated in a horizontal direction. The first vertical portion is elongated in the vertical direction and connected with the first horizontal portions. The two first source/drain structures are disposed at two opposite sides of each of the first horizontal portions in the horizontal direction respectively. The two first source/drain structures are connected with the first horizontal portions.

17 Claims, 22 Drawing Sheets

(56) References Cited

U.S. PATENT DOCUMENTS

2020/0118892 A1  4/2020  Cheng
2020/0274000 A1* 8/2020  Xie .................. H01L 29/66795

* cited by examiner

MANUFACTURING METHOD OF SEMICONDUCTOR DEVICE

CROSS REFERENCE TO RELATED APPLICATIONS

This application is a continuation application of U.S. application Ser. No. 17/163,589, filed on Feb. 1, 2021. The content of the application is incorporated herein by reference.

BACKGROUND OF THE INVENTION

1. Field of the Invention

The present invention relates to a manufacturing method of a semiconductor device, and more particularly, to a manufacturing method of a semiconductor device including a semiconductor channel structure.

2. Description of the Prior Art

The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor. For example, dual-gate fin field effect transistor (FinFET) device, tri-gate FinFET device, and omega-FinFET device have been provided. Furthermore, gate-all-around (GAA) nanowire FET device is progressed for achieving the ongoing goals of high performance, increased miniaturization of integrated circuit components, and greater packaging density of integrated circuits. However, under the concept of the GAA, how to further enhance device characteristics (such as electrical performance) through process and/or structural design is still the direction of continuous efforts by people in related fields.

SUMMARY OF THE INVENTION

It is one of the objectives of the present invention to provide a manufacturing method of a semiconductor device. Surface characteristics of a semiconductor channel structure may be modified by a vertical portion connected with horizontal portions in the semiconductor channel structure, and the electrical performance of the semiconductor device may be enhanced accordingly.

A manufacturing method of a semiconductor device is provided in an embodiment of the present invention. The manufacturing method includes the following steps. A first transistor is formed on a substrate. The first transistor includes a first semiconductor channel structure and two first source/drain structures. The first semiconductor channel structure includes first horizontal portions and a first vertical portion. The first horizontal portions are stacked in a vertical direction and separated from one another. Each of the first horizontal portions is elongated in a horizontal direction. The first vertical portion is elongated in the vertical direction and connected with the first horizontal portions. The two first source/drain structures are disposed at two opposite sides of each of the first horizontal portions in the horizontal direction respectively. The two first source/drain structures are connected with the first horizontal portions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 5-17 are schematic drawings illustrating a manufacturing method of the semiconductor device according to the first embodiment of the present invention, wherein FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, and FIG. 17 is a schematic drawing in a step subsequent to FIG. 16.

FIGS. 23-33 are schematic drawings illustrating a manufacturing method of the semiconductor device according to the fourth embodiment of the present invention, wherein FIG. 24 is a schematic drawing in a step subsequent to FIG. 23, FIG. 25 is a schematic drawing in a step subsequent to FIG. 24, FIG. 26 is a schematic drawing in a step subsequent to FIG. 25, FIG. 27 is a schematic drawing in a step subsequent to FIG. 26, FIG. 28 is a schematic drawing in a step subsequent to FIG. 27, FIG. 29 is a schematic drawing in a step subsequent to FIG. 28, FIG. 30 is a schematic drawing in a step subsequent to FIG. 29, FIG. 31 is a schematic drawing in a step subsequent to FIG. 30, FIG. 32 is a schematic drawing in a step subsequent to FIG. 31, and FIG. 33 is a schematic drawing in a step subsequent to FIG. 32.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
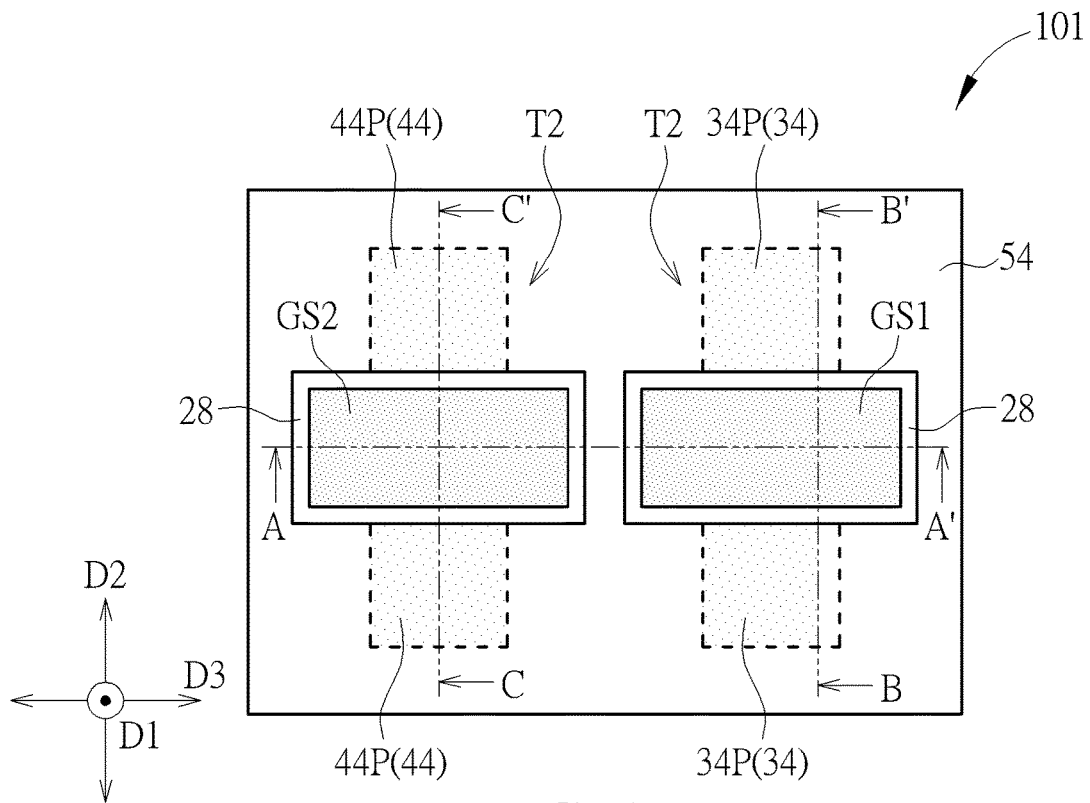
FIG. 1 is a schematic drawing illustrating a semiconductor device according to a first embodiment of the present invention.
Figure 2:
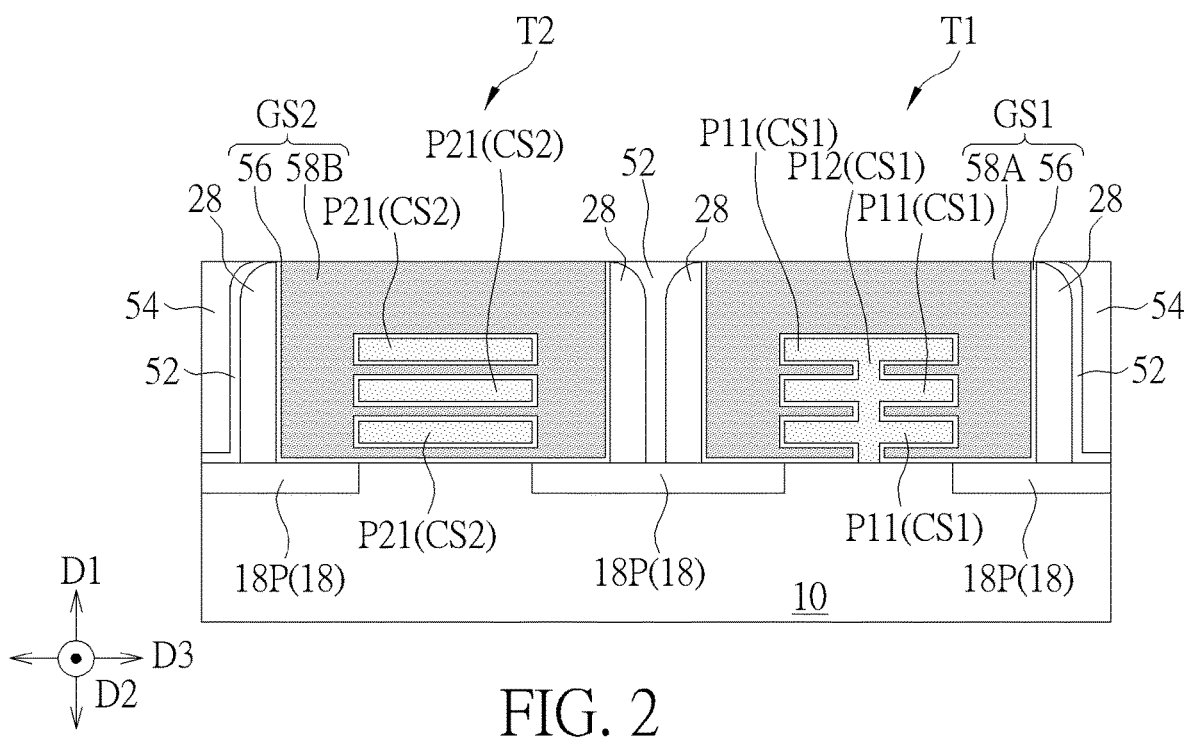
FIG. 2 is a cross-sectional diagram taken along a line A-A' in FIG. 1.
Figure 3:
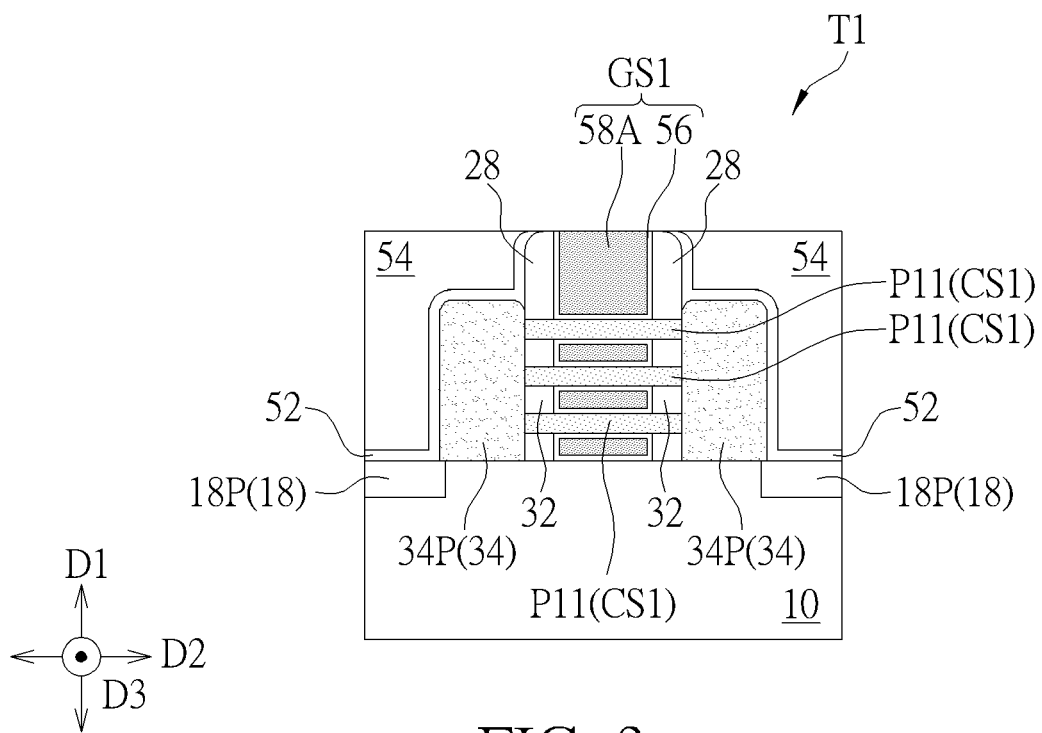
FIG. 3 is a cross-sectional diagram taken along a line B-B' in FIG. 1.
Figure 4:
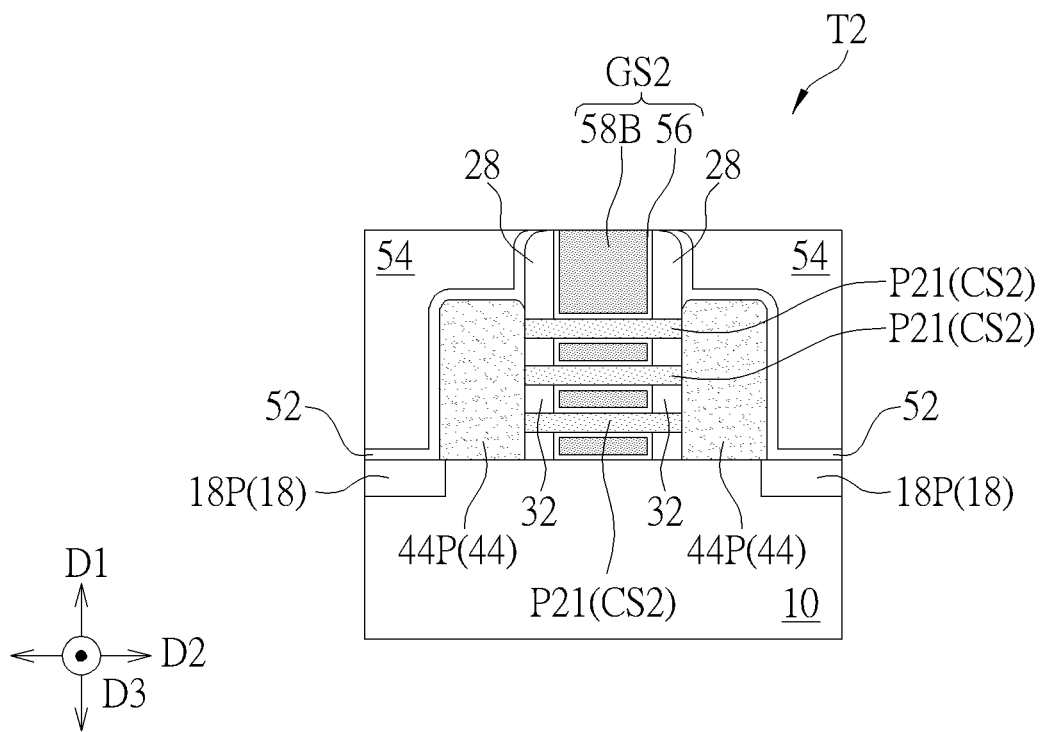
FIG. 4 is a cross-sectional diagram taken along a line C-C' in FIG. 1.

Please refer to FIGS. 1-4. FIG. 1 is a schematic drawing illustrating a semiconductor device according to a first embodiment of the present invention. FIG. 2 is a cross-sectional diagram taken along a line A-A' in FIG. 1, FIG. 3 is a cross-sectional diagram taken along a line B-B' in FIG. 1, and FIG. 4 is a cross-sectional diagram taken along a line C-C' in FIG. 1. As shown in FIGS. 1-4, a semiconductor device 101 includes a substrate 10 and a first transistor T1 disposed on the substrate 10. The first transistor T1 includes a first semiconductor channel structure CS1 and two first source/drain structures 34P. The first semiconductor channel structure CS1 includes a plurality of first horizontal portions P11 and a first vertical portion P12. The first horizontal portions P11 are stacked in a vertical direction (such as a first direction D1 shown in FIGS. 1-4) and separated from one another, and each of the first horizontal portions P11 is elongated in a horizontal direction (such as a second direction D2 shown in FIGS. 1-4). The first vertical portion P12 is elongated in the vertical direction (such as the first direction D1) and connected with the first horizontal portions P11. A material composition of the first vertical portion P12 is identical to a material composition of each of the first horizontal portions P11. The two first source/drain structures 34P are disposed at two opposite sides of each of the first horizontal portions P11 in the horizontal direction (such as the second direction D2) respectively, and the two first source/drain structures 34P are connected with the first horizontal portions P11.

In some embodiments, the first horizontal portions P11 and the first vertical portion P12 may include a semiconductor material, such as silicon, silicon germanium, or other suitable semiconductor materials, and the semiconductor material may be a semiconductor material in an epitaxial state (such as epitaxial silicon, epitaxial silicon germanium, or other suitable epitaxial semiconductor materials), but not limited thereto. Compared with a semiconductor channel structure only including portions extending horizontally (such as the first horizontal portions P11 described above), the total surface area of the semiconductor channel structure may be increased by a portion extending vertically (such as the first vertical portion P12 described above), connected with the portions extending horizontally, and having a material composition identical to that of the portions extending horizontally, and that is beneficial to the electrical performance of the semiconductor device. In addition, when the semiconductor channel structure (such as the first semiconductor channel structure CS1 describe above) is formed with epitaxial materials, a surface orthogonal to the horizontal direction (such as the second direction D2 and/or a third direction D3 shown in FIGS. 1-4) may be (110) lattice plane, and the (110) lattice plane may have carrier mobility higher than that of the (100) lattice plane orthogonal to the vertical direction (such as the first direction D1). Therefore, more area of the (110) lattice plane may be provided by the first vertical portion P12 for further enhancing the driving current of the first transistor T1 and improving other electrical performance related to the carrier mobility.

Specifically, in some embodiments, the first vertical portion P12 may directly contact each of the first horizontal portions P11 and be directly connected with each of the first horizontal portions P11, and the first vertical portion P12 may be regarded as a portion penetrating through each of the first horizontal portions P11 in the first direction D1, but not limited thereto. Additionally, at least a part of each of the first horizontal portions P11 may be regarded as being disposed at two opposite sides of the first vertical portion P12 in a direction orthogonal to the first direction D1 (such as the third direction D3), but not limited thereto. In some embodiments, the first vertical portion P12 may be a columnar structure extending in the first direction D1 and located at the central position in the first semiconductor channel structure CS1 when viewed in a top-view of the semiconductor device 101, and each of the first horizontal portions P11 may surround the first vertical portion P12 in directions orthogonal to the first directions D1 (such as the second direction D2, the third direction D3, and other horizontal directions) accordingly, but not limited thereto. In some embodiments, the first vertical portion P12 may be a fin-shaped structure extending in the second direction D2, and each of the first horizontal portions P11 may be disposed at two opposite sides of the first vertical portion P11 in the third direction D3 substantially orthogonal to the second direction D2, but not limited thereto. Additionally, in some embodiments, a thickness of each of the first horizontal portions P11 may range from 5 nanometers to 100 nanometers, each of the first horizontal portions P11 may be regarded as a nanosheet, and the first transistor T1 may be regarded as a transistor with a hybrid configuration including nanosheets (such as the first horizontal portions P11) and a fin-shaped structure (such as the first vertical portion P12), but not limited thereto.

In some embodiments, the first direction D1 described above may be regarded as a thickness direction of the substrate 10, and the substrate 10 may have a top surface and a bottom surface opposite to the top surface in the first direction D1. The first transistor T1 may be disposed at a side of the top surface of the substrate 10, but not limited thereto. In addition, horizontal directions (such as the second direction D2 and the third direction D3) substantially orthogonal to the first direction D1 may be substantially parallel with the top surface and/or the bottom surface of the substrate 10, but not limited thereto. Additionally, in this description, a distance between the substrate 10 and a relatively higher location and/or a relatively higher part in the first direction D1 is greater than a distance between the substrate 10 and a relatively lower location and/or a relatively lower part in the first direction D1. The bottom or a lower portion of each component may be closer to the substrate 10 in the first direction D1 than the top or upper portion of this component. Another component disposed above a specific component may be regarded as being relatively far from the substrate 10 in the first direction D1, and another component disposed under a specific component may be regarded as being relatively closer to the substrate 10 in the first direction D1.

In some embodiments, the semiconductor device 101 may further include a second transistor T2 disposed on the substrate 10, and the second transistor T2 may include a second semiconductor channel structure CS2 and two second source/drain structures 44P. In some embodiments, the first transistor T1 and the second transistor T2 may be disposed adjacent to each other in a direction orthogonal to the first direction D1 (such as the third direction D3) and separated from each other, but the present invention is not limited to this. In some embodiments, the first transistor T1 and the second transistor T2 may be disposed adjacent to each other in the first direction D1 or in a direction orthogonal to the first direction D1, and the first transistor T1 may be separated from or at least partially connected with the second transistor T2 according to some design considerations. In the second transistor T2, the second semiconductor channel structure CS2 may include a plurality of second horizontal portions P21 stacked in the first direction D1 and separated from one another, and each of the second horizontal portions P21 may be elongated in the horizontal direction (such as the second direction D2 and/or the third direction D3). The two second source/drain structures 44P may be disposed at two opposite sides of each of the second horizontal portions P21 in the second direction D2 respectively, and the two second source/drain structures 44P may be connected with the second horizontal portions P21. In some embodiments, the first source/drain structures 34P may directly contact and be directly connected with the first horizontal portions P11 and/or the first vertical portion P12 of the first semiconductor channel structure CS1, and the second source/drain structures 44P may directly contact and be directly connected with the second horizontal portions P21 of the second semiconductor channel structure CS2, but not limited thereto. Additionally, the second horizontal portions P21 of the second semiconductor channel structure CS2 may include a semiconductor material, such as silicon, silicon germanium, or other suitable semiconductor materials, and the semiconductor material may be a semiconductor material in an epitaxial state, but not limited thereto. In some embodiments, a material composition of each of the second horizontal portions P21 in the second semiconductor channel structure CS2 may be identical to or different from a material composition of each of the first horizontal portions P11 of the first semiconductor channel structure CS1 according to some design considerations.

For example, in some embodiments, the first transistor T1 and the second transistor T2 may be transistors of different conductivity types. For instance, the first transistor T1 may be a p-type transistor and the second transistor T2 may be an n-type transistor, or the first transistor T1 may be an n-type transistor and the second transistor T2 may be a p-type transistor. When the first transistor T1 and the second transistor T2 are transistors of different conductivity types respectively, the material composition of the second semiconductor channel structure CS2 (such as the semiconductor material and/or the impurities formed in the semiconductor material) may be different from the material composition of the first semiconductor channel structure CS1 (such as the semiconductor material and/or the impurities formed in the semiconductor material) for the needs of transistors of different conductivity types, and the conductivity type of the second semiconductor channel structure CS2 may be complementary to the conductivity type of the first semiconductor channel structure CS1, but not limited thereto. For example, the first semiconductor channel structure CS1 and the second semiconductor channel structure CS2 may be an n-type semiconductor channel structure and a p-type semiconductor channel structure, respectively, but not limited thereto. In addition, the first source/drain structure 34P and the second source/drain structure 44P may include an epitaxial material, respectively, such as epitaxial silicon, epitaxial silicon germanium (SiGe), epitaxial silicon phosphide (SiP), or other suitable epitaxial materials. When the first transistor T1 and the second transistor T2 are transistors of different conductivity types respectively, the material composition of the first source/drain structures 34P (such as the epitaxial material and/or the impurities formed in the epitaxial material) may be different from the material composition of the second source/drain structure 44P (such as the epitaxial material and/or the impurities formed in the epitaxial material), and the conductivity type of the first source/drain structure 34P may be complementary to the conductivity type of the second source/drain structure 44P, but not limited thereto.

In some embodiments, the first transistor T1 may further include a first gate structure GS1 disposed on the substrate 10, and the second transistor T2 may further include a second gate structure GS2 disposed on the substrate 10. In some embodiments, the first gate structure GS1 may be substantially elongated in the third direction D3, and the two first source/drain structures 34P may be disposed at two opposite sides of the first gate structure GS1 in the second direction D2; and the second gate structure GS2 may be substantially elongated in the third direction D3 also, and the two second source/drain structures 44P may be disposed at two opposite sides of the second gate structure GS2 in the second direction D2, but not limited thereto. The first gate structure GS1 may encompass each of the first horizontal portions P11 and the first vertical portion P12 of the first semiconductor channel structure CS1, and the second gate structure GS2 may encompass each of the second horizontal portions P21 of the second semiconductor channel structure CS2. Therefore, the first transistor T1 and the second transistor T2 may be regarded as a gate-all-around (GAA) transistor structure, respectively, but not limited thereto. In some embodiments, the first gate structure GS1 may include a gate dielectric layer 56 and a first gate material layer 58A, and the second gate structure GS2 may include the gate dielectric layer 56 and a second gate material layer 58B. In the first transistor T1, a part of the gate dielectric layer 56 may encompass each of the first horizontal portions P11 and the first vertical portion P12 of the first semiconductor channel structure CS1 and be disposed between the first gate material layer 58A and the first semiconductor channel structure CS1. In the second transistor T2, a part of the gate dielectric layer 56 may encompass each of the second horizontal portions P21 of the second semiconductor channel structure CS2 and be disposed between the second gate material layer 58B and the second semiconductor channel structure CS2.

In some embodiments, a part of the first gate structure GS1 may be disposed between the first horizontal portion P11 of the first semiconductor channel structure CS1 and the substrate 10 in the first direction D1, and a part of the second gate structure GS2 may be disposed between the second horizontal portion P21 of the second semiconductor channel structure CS2 and the substrate 10 in the first direction D1. Additionally, the first vertical portion P12 of the first semiconductor channel structure CS1 may directly contact and be directly connected with the substrate 10, but not limited thereto. In some embodiments, a material composition of the first gate material layer 58A may be identical to or different from a material composition of the second gate material layer 58B according to some design considerations. For example, when the first transistor T1 and the second transistor T2 are transistors of different types (such as an n-type transistor and a p-type transistor, respectively), the first gate material layer 58A and the second gate material layer 58B may include different work function layers respectively for the needs of transistors of different types, but not limited thereto. In addition, the first gate structure GS1 and the second gate structure GS2 may be separated from each other or connected with each other according to different design considerations. For example, when the first gate structure GS1 and the second gate structure GS2 have different material compositions, the first gate structure GS1 and the second gate structure GS2 may be disposed separated from each other, but not limited thereto.

In some embodiments, the first semiconductor channel structure CS1 of the first transistor T1 may include the first horizontal portions P11 and the first vertical portion P12 described above, and the second semiconductor channel structure CS2 of the second transistor T2 may include the second horizontal portions P21 without including a vertical portion connected with the second horizontal portions P21 for the needs of transistors of different types. For example, when the material of the first semiconductor channel structure CS1 and the material of the second semiconductor channel structure CS2 are both epitaxial silicon, a lateral surface of the first vertical portion P12 (such as the (110) lattice surface described above) may have a relatively higher electric hole mobility which is beneficial to the related electrical performance of the p-type transistor, the first transistor T1 including the semiconductor channel structure having the vertical portion may be a p-type transistor preferably, and the second transistor T2 including the semiconductor channel structure without the vertical portion may be an n-type transistor accordingly, but not limited thereto.

In some embodiments, the semiconductor device 101 may further include a spacer 28, a spacer 32, an etching stop layer 52, and a dielectric layer 54. The spacer 32 may be partly disposed on sidewalls of a relatively lower portion of the first gate structure GS1 and partly disposed on sidewalls of a relatively lower portion of the second gate structure GS2, and the spacer 28 may be partly disposed on sidewalls of a relatively upper portion of the first gate structure GS1 and partly disposed on sidewalls of a relatively upper portion of the second gate structure GS2. Therefore, in some embodiments, a part of the spacer 28 and a part of the spacer 32 may be disposed between the first gate structure GS1 and the first source/drain structure 34P in the second direction D2, and another part of the spacer 28 and another part of the spacer 32 may be disposed between the second gate structure GS2 and the second source/drain structure 44P in the second direction D2. In addition, the etching stop layer 52 may be disposed on sidewalls of the spacer 28, the first source/drain structures 34P, and the second source/drain structures 44P, and the dielectric layer 54 may be disposed on the etching stop layer 52.

In some embodiments, the substrate 10 may include a semiconductor substrate, such as a silicon substrate, an epitaxial silicon substrate, a silicon germanium substrate, a silicon carbide substrate, or a silicon-on-insulator (SOI) substrate, but not limited thereto. In some embodiments, an isolation structure 18P may be disposed in the substrate 10 for isolating areas corresponding to different transistors in the substrate 10, and the isolation structure 18P may include a single layer or multiple layers of insulation materials, such as oxide insulation materials (silicon oxide, for example), or other suitable insulation materials. The spacer 28 and the spacer 32 may respectively be a single layer or multiple layers of insulation materials, such as silicon oxide, silicon nitride, silicon oxynitride, or other suitable insulation materials. The etching stop layer 52 and the dielectric layer 54 may include silicon oxide, silicon nitride, silicon oxynitride, a low dielectric constant (low-k) dielectric material, or other suitable insulation materials, respectively. The gate dielectric layer 56 may include a high dielectric constant (high-k) dielectric material or other suitable dielectric materials. The high-k dielectric material described above may include hafnium oxide ($HfO_X$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The first gate material layer 58A and the second gate material layer 58B may include a non-metallic electrically conductive material (such as doped polysilicon) or a metallic electrically conductive material, such as a metal gate structure formed with a work function layer and a low electrical resistivity layer stacked with each other, but not limited thereto. The work function layer described above may include titanium nitride (TiN), titanium carbide (TiC), tantalum nitride (TaN), tantalum carbide (TaC), tungsten carbide (WC), titanium tri-aluminide ($TiAl_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials.

Figure 5:
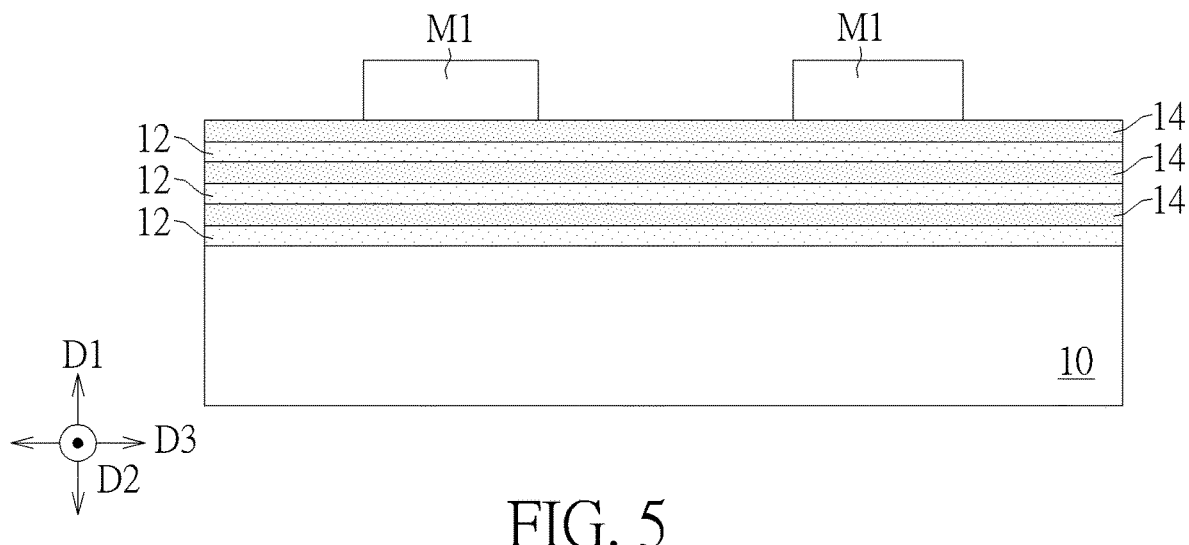
Figure 6:
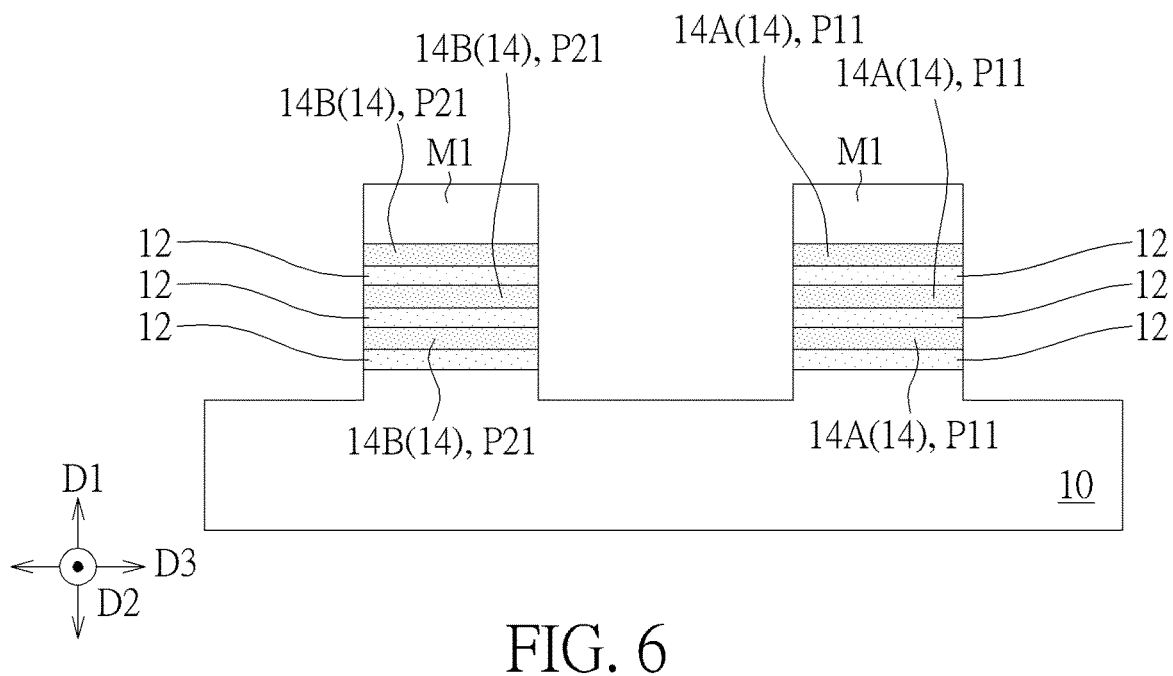
Figure 7:
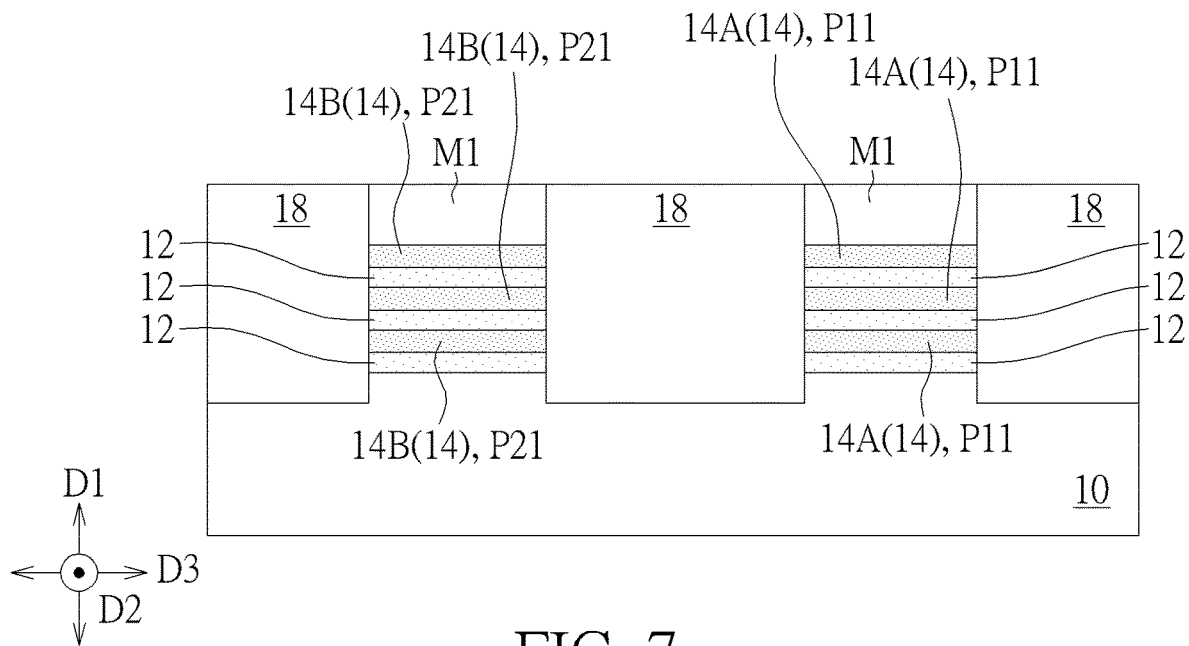
Figure 8:
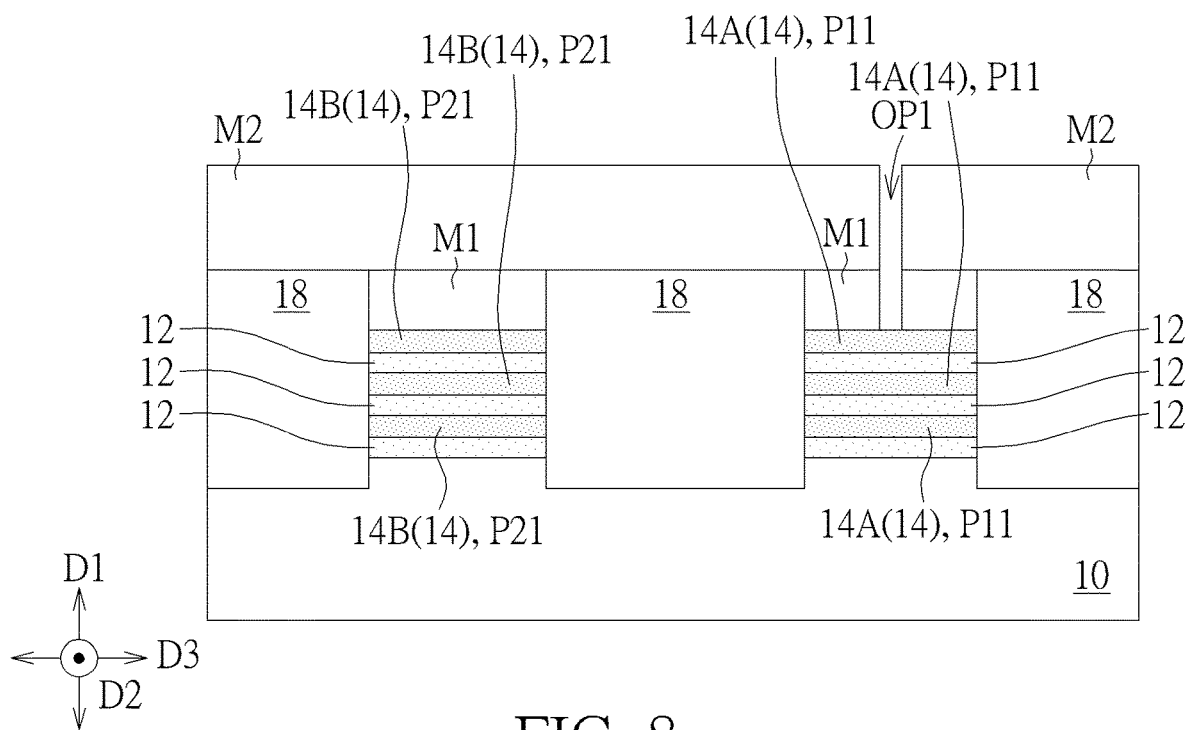
Figure 9:
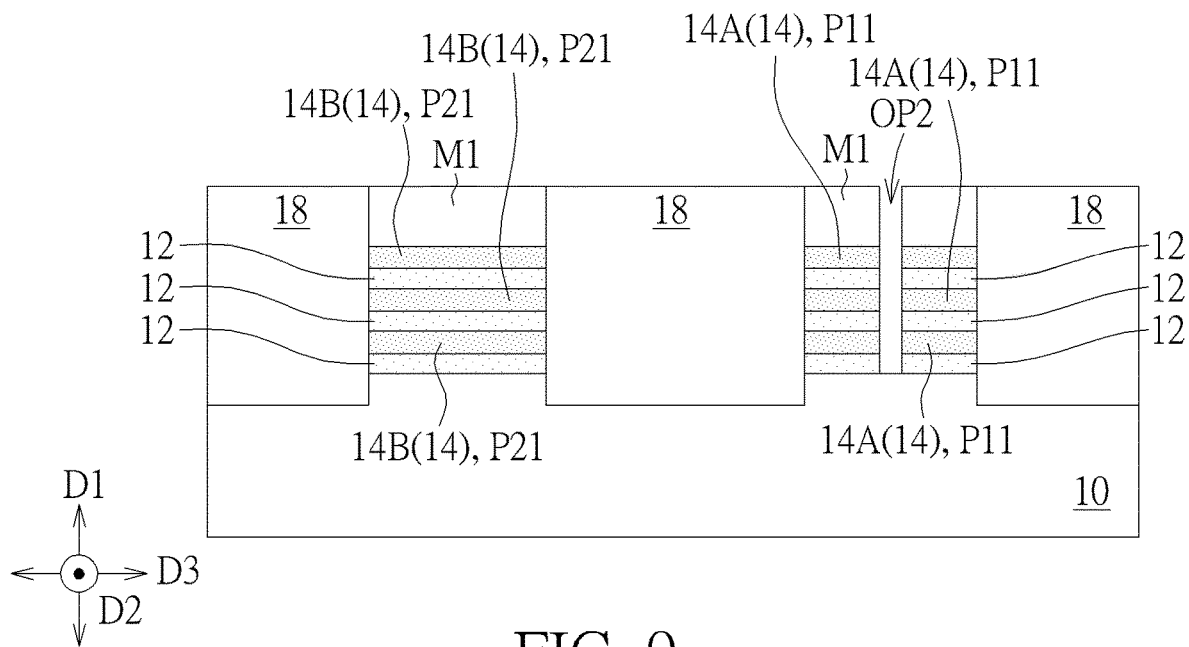
Figure 10:
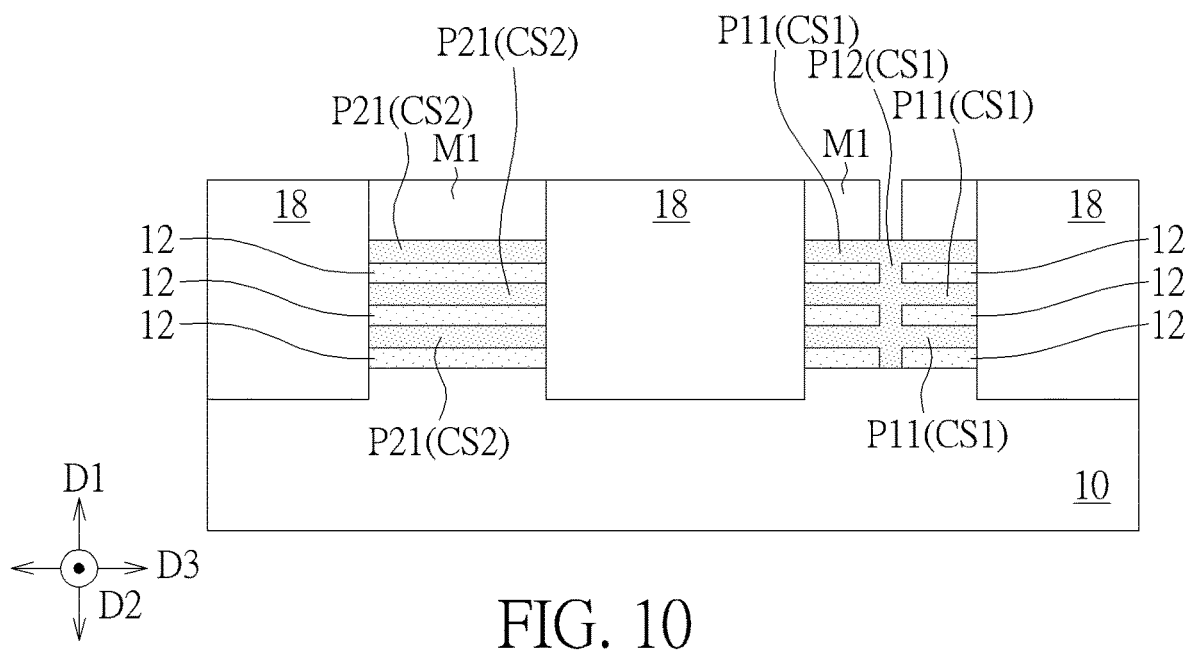
Figure 11:
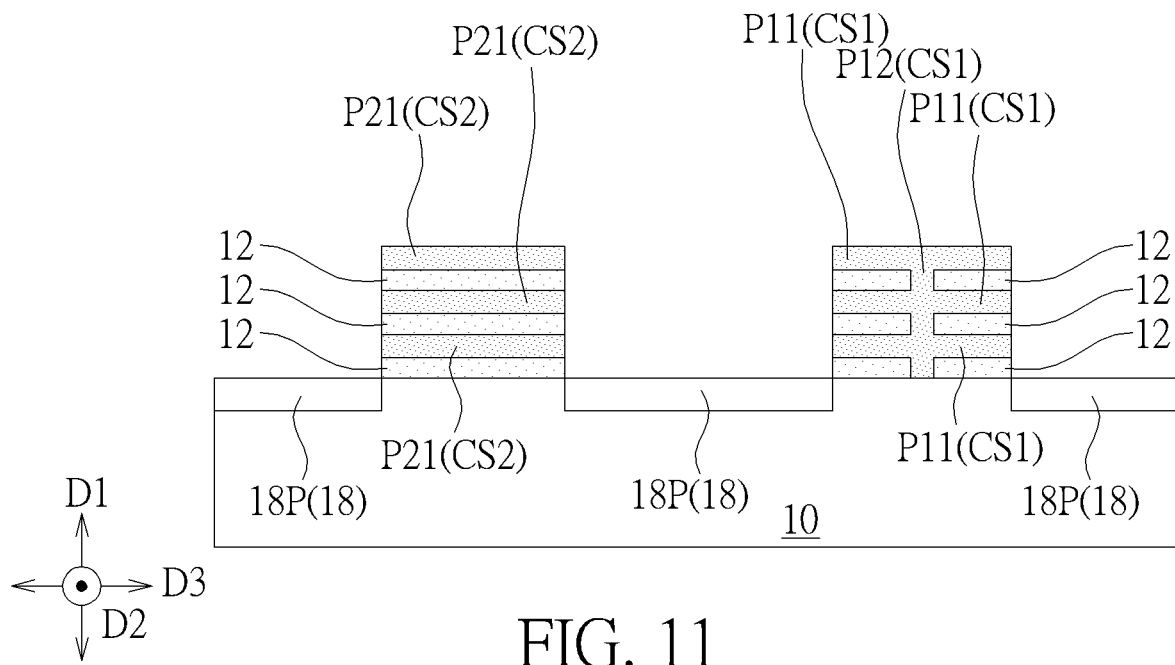
Figure 12:
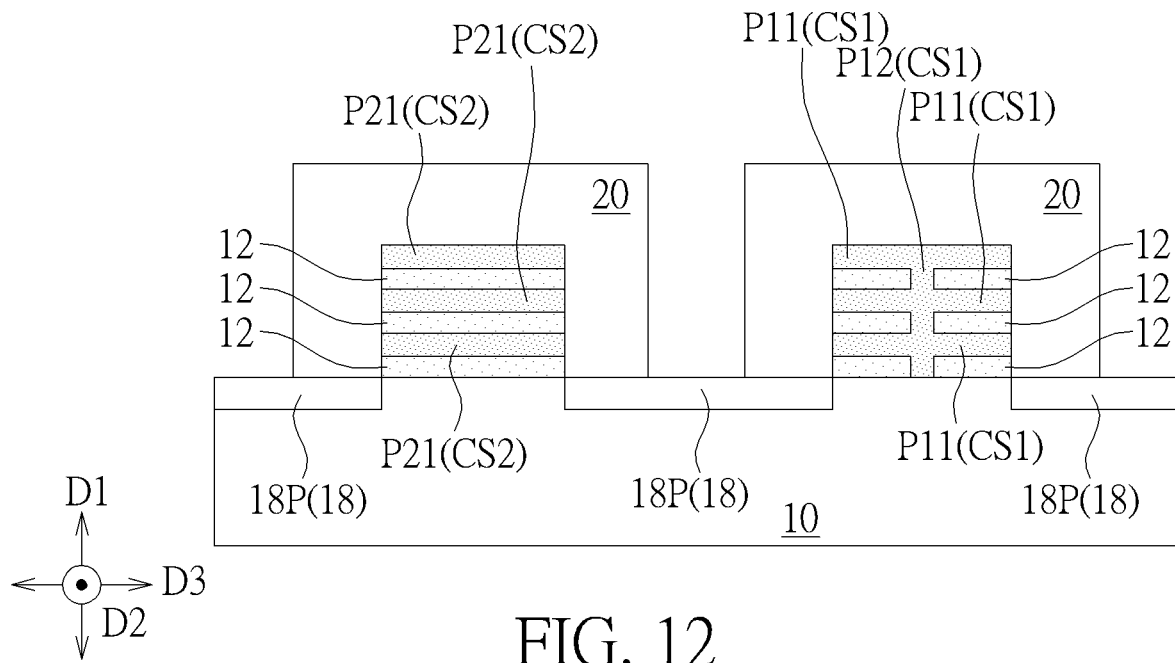
Figure 13:
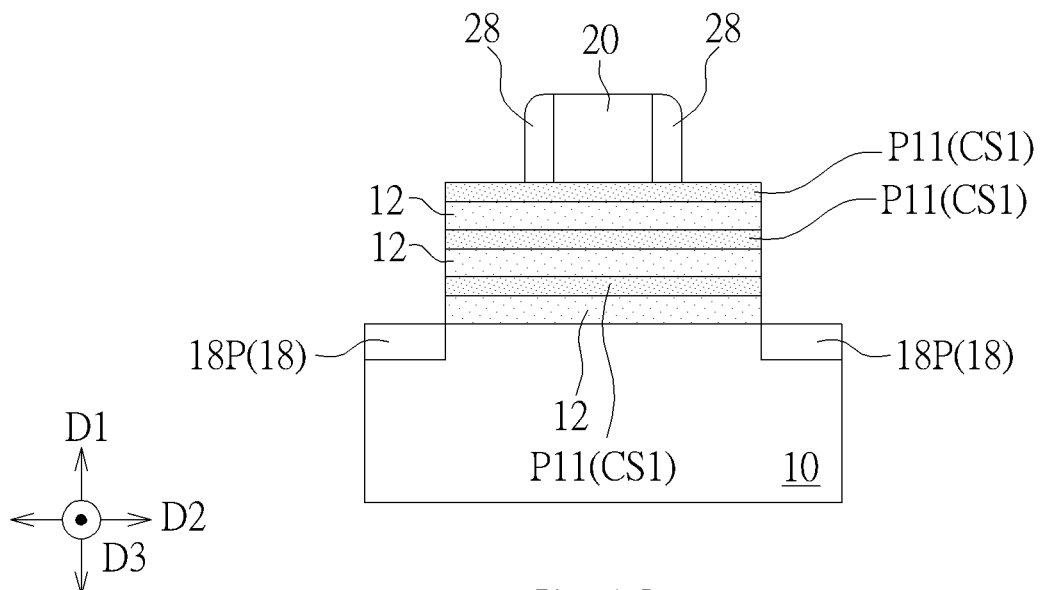
Figure 14:
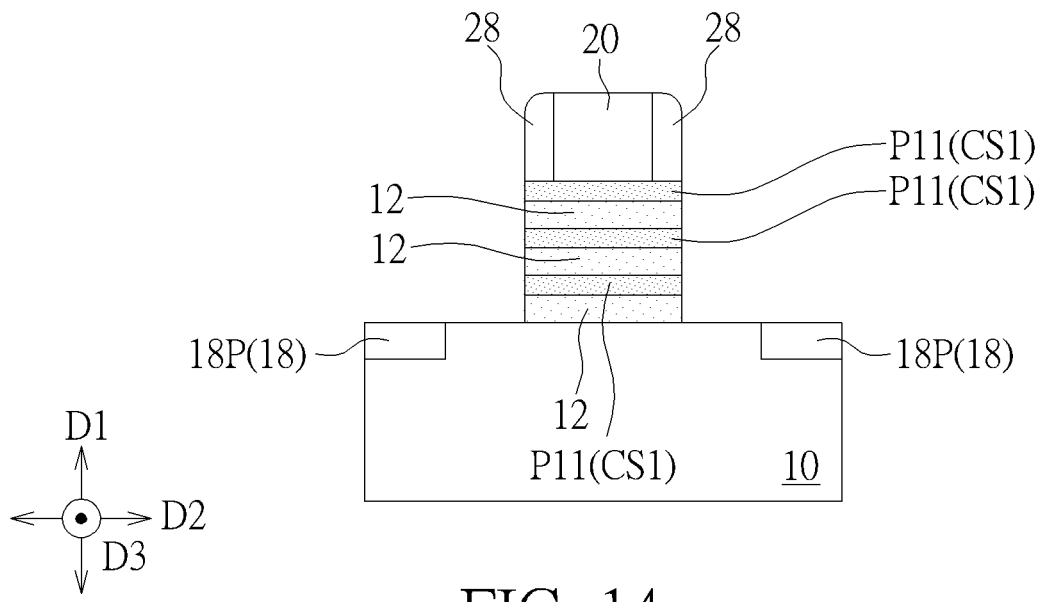
Figure 15:
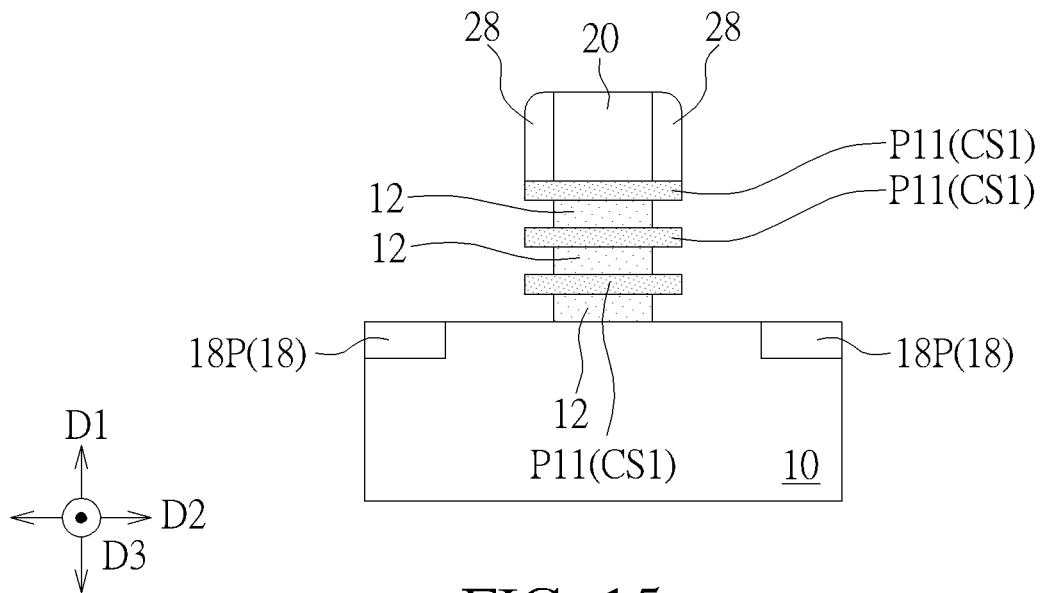
Figure 16:
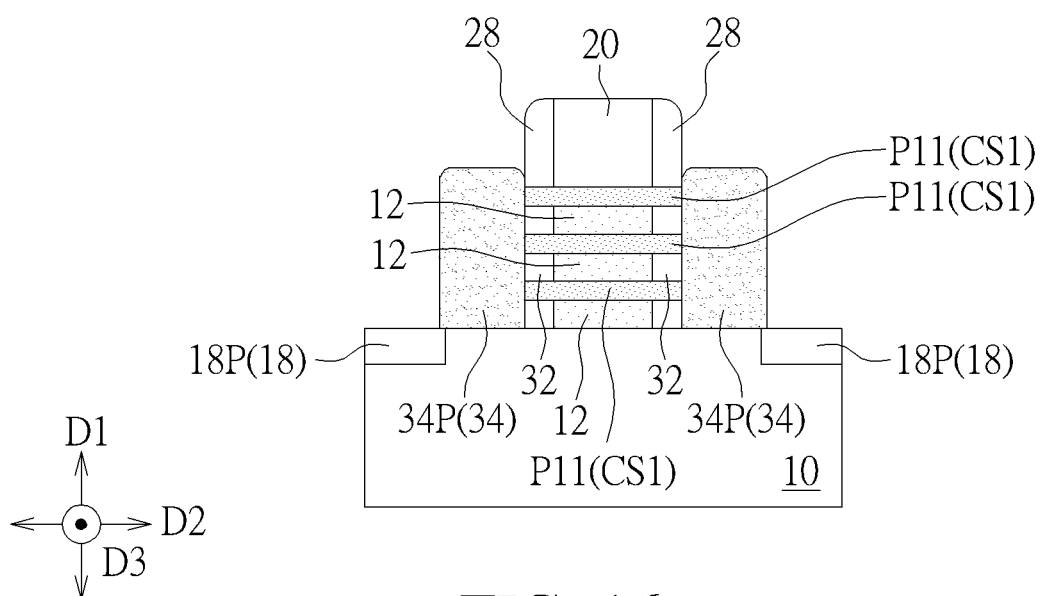
Figure 17:
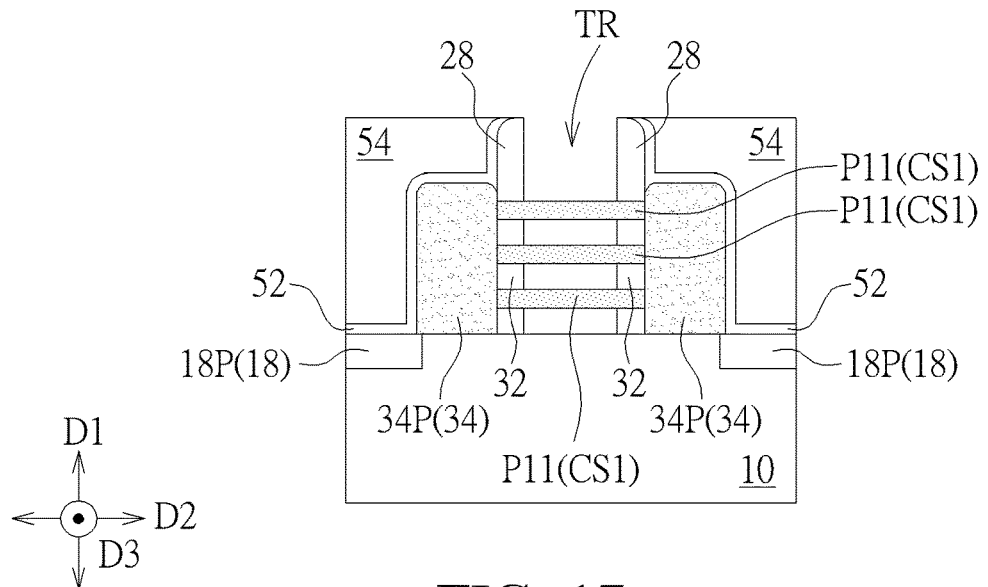

Please refer to FIGS. 1-17. FIGS. 5-17 are schematic drawings illustrating a manufacturing method of the semiconductor device according to the first embodiment of the present invention, wherein FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, FIG. 17 is a schematic drawing in a step subsequent to FIG. 16, and FIGS. 2-4 may be regarded as schematic drawings in a step subsequent to FIG. 17. As shown in FIGS. 1-4, a manufacturing method of the semiconductor device 101 in this embodiment may include the following steps. Firstly, the substrate 10 is provided, and the first transistor T1 and the second transistor T2 are formed on the substrate 10. The first transistor T1 includes the first semiconductor channel structure CS1 and the two first source/drain structures 34P. The first semiconductor channel structure CS1 includes a plurality of the first horizontal portions P11 and the first vertical portion P12. The first horizontal portions P11 are stacked in a vertical direction (such as the first direction D1) and separated from one another, and each of the first horizontal portions P11 is elongated in a horizontal direction (such as the second direction D2). The first vertical portion P12 is elongated in the first direction D1 and connected with the first horizontal portions P11. The material composition of the first vertical portion P12 is identical to the material composition of each of the first horizontal portions P11. The two first source/drain structures 34P are disposed at two opposite sides of each of the first horizontal portions P11 in the second direction D2 respectively, and the two first source/drain structures 34P are connected with the first horizontal portions P11. In addition, the second transistor T2 includes the second semiconductor channel structure CS2 and the two second source/drain structures 44P. The second semiconductor channel structure CS2 includes a plurality of the second horizontal portions P21 stacked in the first direction D1 and separated from one another, and each of the second horizontal portions P21 may be elongated in a horizontal direction (such as the second direction D2 and/or the third direction D3). The two second source/drain structures 44P are disposed at two opposite sides of each of the second horizontal portions P21 in the second direction D2 respectively, and the two second source/drain structures 44P are connected with the second horizontal portions P21.

Specifically, the manufacturing method of the semiconductor device 101 in this embodiment may include but is not limited to the following steps. Firstly, as shown in FIG. 5, a plurality of first semiconductor layers 14 and a sacrificial material 12 may be formed on the substrate 10. The first semiconductor layers 14 may be stacked in the first direction D1 and separated from one another, and the sacrificial material 12 may be partly disposed between the first semiconductor layers 14 and partly disposed between the first semiconductor layer 14 and the substrate 10. Subsequently, a first patterned mask layer M1 may be formed on the topmost first semiconductor layer 14. In some embodiments, a material composition of the sacrificial material 12 may be different from a material composition of the first semiconductor layers 14 for providing required etching selectivity. For example, in some embodiments, the material of the first semiconductor layers 14 may be a silicon semiconductor material (such as epitaxial silicon), and the material of the sacrificial material 12 may be silicon germanium (SiGe) for constituting a superlattice epitaxial structure, but not limited thereto. Subsequently, as shown in FIG. 5 and FIG. 6, a patterning process (such as an etching process) may be performed to the first semiconductor layers 14, the sacrificial material 12, and a part of the substrate 10 with the first patterned mask layer M1 as a mask for forming a plurality of first portions 14A stacked in the first direction D1 and separated from one another and a plurality of second portions 14B stacked in the first direction D1 and separated from one another. The first portions 14A may be used for forming the first horizontal portions P11 of the first semiconductor channel structure described above, and the second portions 14B may be used for forming the second horizontal portions P21 of the second semiconductor channel structure described above, but not limited thereto. In some embodiments, the first patterned mask layer M1 may include nitride (such as silicon nitride) or other suitable materials having the required etching selectivity for the first semiconductor layer 14, the sacrificial material 12, and the substrate 10.

Subsequently, as shown in FIG. 7, an isolation material 18 may be formed on the exposed substrate 10, and a planarization process may be performed to the isolation material 18 and the first patterned mask layer M1 for making the top surface of the isolation material 18 substantially coplanar with the top surface of the first patterned mask layer M1, but not limited thereto. The planarization process described above may include a chemical mechanical polishing (CMP) process, an etching back process, or other suitable planarization approaches. In addition, a material composition of the isolation material may be different from a material composition of the first patterned mask layer M1 for providing the required etching selectivity in the subsequent processes. For instance, the isolation material 18 may include oxide (such as silicon oxide) or other suitable insulation materials, but not limited thereto. Subsequently, as shown in FIG. 8, a second patterned mask layer M2 may be formed on the isolation material 18 and the first patterned mask layer M1, the first patterned mask layer M1 on the first portions 14A may be etched by using the second patterned mask layer M2 as a mask for forming a first opening OP1 in the first patterned mask layer M1 on the first portions 14A, and the first opening OP1 may expose a part of the first portion 14A located at the topmost location. In some embodiments, a material composition of the second patterned mask layer M2 may be different from the material composition of the first patterned mask layer M1 for providing the required etching selectivity. For example, the second patterned mask layer M2 may include a photoresist material, but not limited thereto.

As shown in FIG. 8 and FIG. 9, the first portions 14A stacked in the first direction D1 and the sacrificial material 12 located between the adjacent first portions 14A may be etched by using the first patterned mask layer M1 and the first opening OP1 formed in the first patterned mask layer M1 for forming a second opening OP2 penetrating through the first portions 14A and the sacrificial material 12 in the first direction D1. In some embodiments, the second patterned mask layer M2 may be removed after the step of forming the second opening OP2 or before the step of forming the second opening OP2. Subsequently, as shown in FIG. 9 and FIG. 10, the first vertical portion P12 of the first semiconductor channel structure CS1 described above may be formed in the second opening OP2 for forming the first semiconductor channel structure CS1 including the first horizontal portions P11 and the first vertical portion P12. Therefore, in some embodiments, the first vertical portion P12 in the first semiconductor channel structure CS1 may be formed after the step of forming the first horizontal portions P11, but not limited thereto. In some embodiments, the first vertical portion P12 may be formed by an epitaxial growth process or other suitable approaches, and the material composition of the first vertical portion P12 may be identical to or different from the material composition of the first horizontal portions P11 according to different design considerations. Additionally, in some embodiments, the second portions 14B of the first semiconductor layers 14 may be used as the second horizontal portions P21 of the second semiconductor channel structure CS2, and the material composition of the second horizontal portions P21 in the second semiconductor channel structure CS2 may be identical to the material composition of the first horizontal portions P11 in the first semiconductor channel structure CS1 accordingly, but not limited thereto.

It is worth noting that the method of forming the first semiconductor channel structure CS1 and the second semiconductor channel structure CS2 in the present invention may include but is not limited to the steps shown in FIGS. 5-10 described above, and the first semiconductor channel structure CS1 and the second semiconductor channel structure CS2 with different material compositions may be formed by other suitable approaches according to some design considerations. For example, in some embodiments, the first horizontal portions P11 of the first semiconductor channel structure CS1 and the second horizontal portions P21 of the second semiconductor channel structure CS2 may be formed with different semiconductor materials and/or be formed by different patterning processes, respectively, and the material composition of the first horizontal portions P11 of the first semiconductor channel structure CS1 (such as the semiconductor material and/or the impurities formed in the semiconductor material) may be different from the material composition of the second horizontal portions P21 of the second semiconductor channel structure CS2 (such as the semiconductor material and/or the impurities formed in the semiconductor material) accordingly.

Subsequently, as shown in FIG. 10 and FIG. 11, after the step of forming the first semiconductor channel structure CS1 and the second semiconductor channel structure CS2, an etching back process may be performed to the isolation material 18 for forming the isolation structure 18P in the substrate 10, and the first patterned mask layer M1 may be removed. As shown in FIG. 11 and FIG. 12, dummy gate structures 20 may then be formed on the first semiconductor channel structure CS1 and the second semiconductor channel structure CS2 respectively. The dummy gate structure 20 on the first semiconductor channel structure CS1 may be disposed straddling two opposite sides of the first semiconductor channel structure CS1 in the third direction D3, and the dummy gate structure 20 on the second semiconductor channel structure CS2 may be disposed straddling two opposite sides of the second semiconductor channel structure CS2 in the third direction D3. In some embodiments, the dummy gate structure 20 may include a dielectric layer (not shown), a dummy gate material (not shown), and a gate cap layer (not shown). The dielectric layer may include oxide or other suitable dielectric materials, the dummy gate material may include polysilicon, amorphous silicon, or other suitable materials, and the gate cap layer may include nitride, oxynitride, or other suitable insulation materials, but not limited thereto. Subsequently, as shown in FIG. 12 and FIG. 13, the spacer 28 may be formed on sidewalls of the dummy gate structures 20. It is worth noting that, FIGS. 13-17 are cross-sectional diagrams of the region for forming the first transistor described above and taken in a plane parallel with the first direction D1 and the second direction D2, the manufacturing method of the region for forming the second transistor described above after the step of forming the dummy gate structures 20 may be similar to that of the region for forming the first transistor, and the corresponding diagrams are not shown and illustrated accordingly.

As shown in FIG. 13 and FIG. 14, in the region for forming the first transistor described above, a patterning process may be performed to the first semiconductor channel structure CS1 and the sacrificial material 12 with the dummy gate structure 20 and the spacer 28 as a mask for removing a part of the sacrificial material 12 and a part of each of the first horizontal portions P11. Similarly, in the region for forming the second transistor described above, a patterning process may be performed to the second semiconductor channel structure and the sacrificial material with the dummy gate structure and the spacer as a mask for removing a part of the sacrificial material and a part of each of the second horizontal portions. Subsequently, as shown in FIG. 14 and FIG. 15, a recessing process may be performed to the sacrificial material 12 for reducing the length of the sacrificial material 12 in the second direction D2 and further exposing a part of each of the first horizontal portions P11 and a part of each of the second horizontal portions. The recessing process described above may include an etching process having high etching selectivity between the sacrificial material 12, the first horizontal portions P11, and the second horizontal portions for reducing negative influence on the first horizontal portions P11 and the second horizontal portions, but not limited thereto.

As shown in FIG. 15 and FIG. 16, the spacer 32 may then be formed on the sidewalls of the sacrificial material 12, and a first epitaxial material 34 may be formed on the substrate 10 after the step of forming the spacer 32. In some embodiments, an epitaxial growth process may be carried out from the exposed substrate 10 and an edge of each of the first horizontal portions P11 for forming the first epitaxial material 34, and the first epitaxial material 34 may be connected with each of the first horizontal portions P11 accordingly, but not limited thereto. Comparatively, in the region for forming the second transistor described above, an epitaxial material for forming the second source/drain structures (such as the second epitaxial material 44 shown in FIG. 4 described above) may be formed by an epitaxial growth process identical to or different from the epitaxial growth process for forming the first epitaxial material 34. In some embodiments, the dimension of the first epitaxial material 34 at the time of formation may be controlled for directly forming the first source/drain structures 34P or the first epitaxial material 34 may be patterned to be the first source/drain structures 34P. Similarly, the dimension of the second epitaxial material at the time of formation may be controlled for directly forming the second source/drain structures or the second epitaxial material 34 may be patterned to be the second source/drain structures.

Subsequently, as shown in FIG. 16, FIG. 17, FIG. 3, and FIG. 4, in some embodiments, the first gate structure GS1 and the second gate structure GS2 may be formed by replacing the dummy gate structures 20 and the sacrificial material 12 with the gate dielectric layer 56 and the gate material layer (such as the first gate material layer 58A and the second gate material layer 58B). For example, after the step of forming the first source/drain structures 34P and the second source/drain structures 44P, the etching stop layer 52 and the dielectric layer 54 may be formed covering the first source/drain structures 34P, the second source/drain structures 44P, the spacer 28, and the dummy gate structures 20. A planarization process may then be performed for removing a part of the dielectric layer 54, a part of the etching stop layer 52, and a part of the dummy gate structure 20 (such as the gate cap layer described above) and exposing the remaining portion of the dummy gate structure 20. Subsequently, the exposed dummy gate structure 20 and the sacrificial material 12 may be removed for forming a trench TR. The trench TR may be surrounded by the spacer 28 and the spacer 32 in the horizontal directions. In the region for forming the first transistor T1, each of the first horizontal portions P11 and the first vertical portion P12 may be at least partly disposed in the trench TR. In the region for forming the second transistor T2, each of the second horizontal portions P21 may be at least partly disposed in the trench TR. Subsequently, the gate dielectric layer 56 and the first gate material layer 58A may be formed sequentially in the trench TR for forming the first gate structure GS1. Comparatively, in the region for forming the second transistor T2, the gate dielectric layer 56 and the second gate material layer 58B may be formed sequentially in the trench TR for forming the second gate structure GS2. In addition, the method of forming the first gate structure GS1 and the second gate structure GS2 in this embodiment may include but is not limited to the steps described above. In some embodiments, the first gate structure GS1 and the second gate structure GS2 may be formed by other suitable approaches according to some process and/or design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 18:
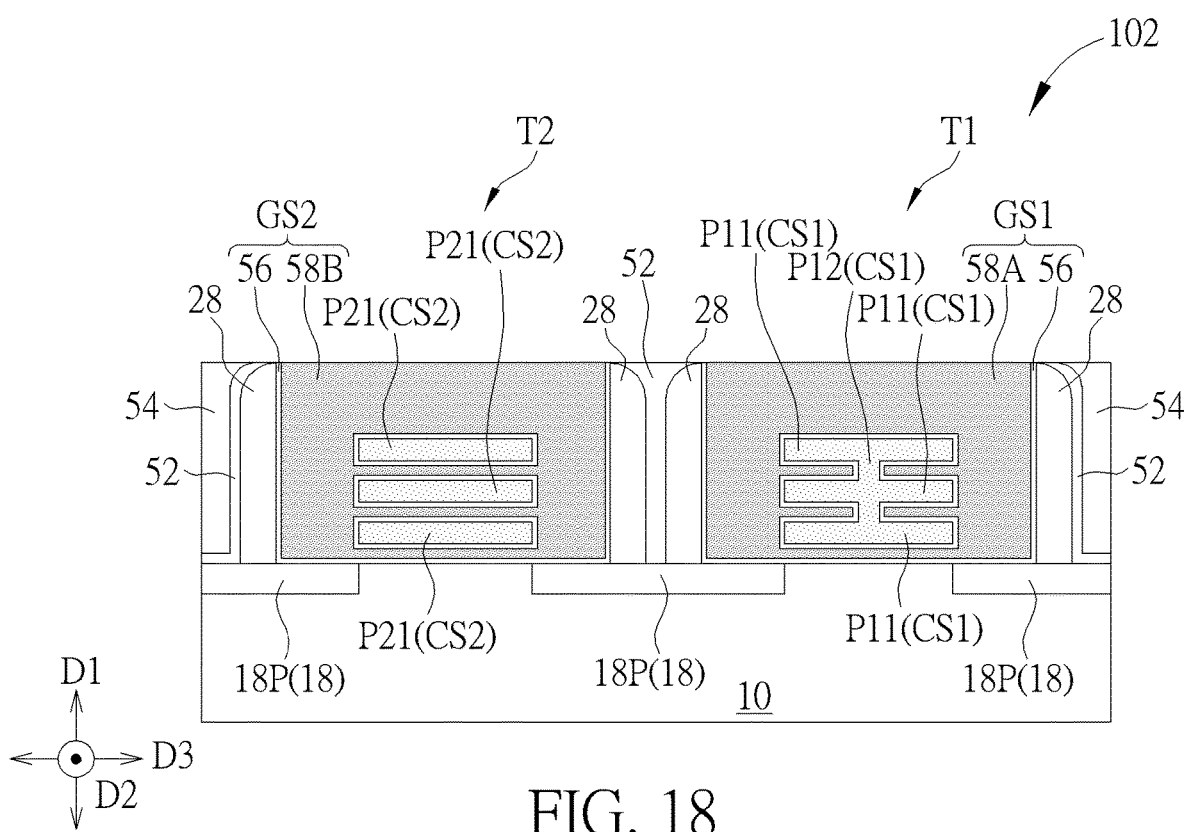
FIG. 18 is a schematic drawing illustrating a semiconductor device according to a second embodiment of the present invention.

Please refer to FIG. 18. FIG. 18 is a schematic drawing illustrating a semiconductor device 102 according to a second embodiment of the present invention. As shown in FIG. 18, in some embodiments, the first vertical portion P12 of the first semiconductor channel structure CS1 may be separated from the substrate 10, and a part of the first gate structure GS1 may be disposed between the first vertical portion P12 of the first semiconductor channel structure CS1 and the substrate 10 in the first direction D1. The condition of the surface of the first semiconductor channel structure CS1 covered by the first gate structure GS1 (such as proportions of different types of surfaces) may be adjusted and/or the negative influence of the first semiconductor channel structure CS1 directly connected with the substrate 10 on the operation of the first transistor T1 may be reduced by controlling the connection between the first vertical portion P12 and the substrate 10, but not limited thereto. In some embodiments, a bottommost surface of the first vertical portion P12 in the first direction D1 and a bottommost surface of the bottommost first horizontal portion P11 may be substantially coplanar, and a topmost surface of the first vertical portion P12 in the first direction D1 and a topmost surface of the topmost first horizontal portion P11 may be substantially coplanar, but not limited thereto. It is worth noting that the structural design of the first semiconductor channel structure CS1 in this embodiment described above may be applied to the first transistor T1 and/or the second transistor T2 in other embodiments of the present invention according to some considerations. Additionally, the material composition of the first semiconductor channel structure CS1 may be identical to or different from the material composition of the second semiconductor channel structure CS2 according to some design considerations.

Figure 19:
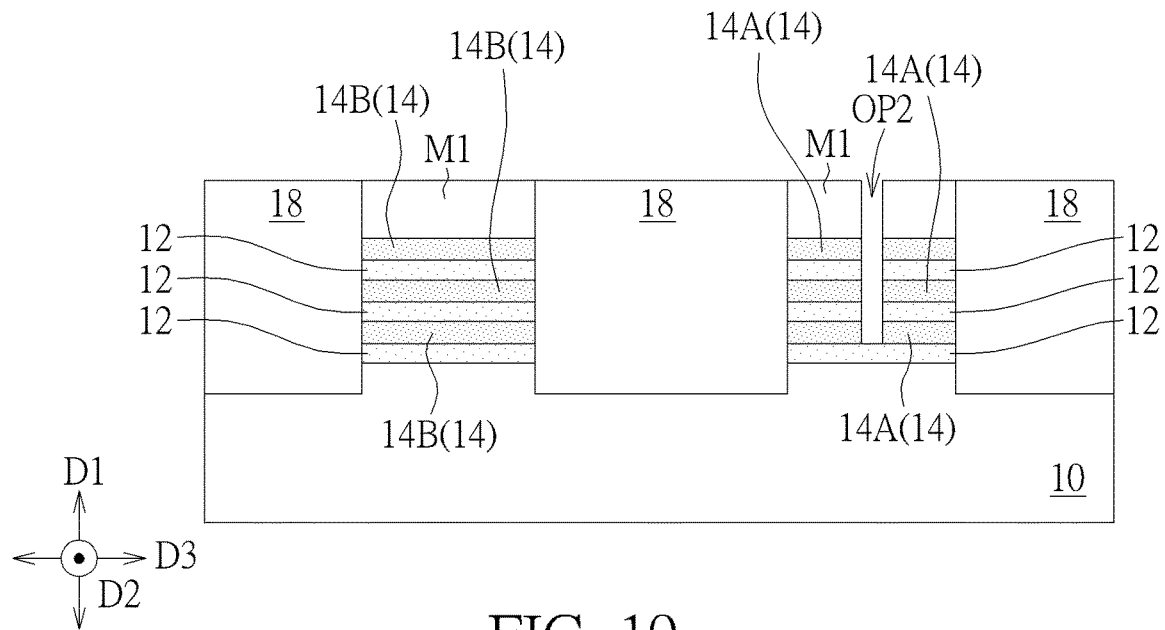
FIG. 19 is a schematic drawing illustrating a manufacturing method of the semiconductor device according to the second embodiment of the present invention.

Please refer to FIG. 8, FIG. 18, and FIG. 19. FIG. 19 is a schematic drawing illustrating a manufacturing method of the semiconductor device 102 in this embodiment. FIG. 8 may be regarded as a schematic drawing in a step before FIG. 19, and FIG. 18 may be regarded as a schematic drawing in a step subsequent to FIG. 19. The manufacturing method of the semiconductor device 102 in this embodiment may include but is not limited to the following steps. As shown in FIG. 8, FIG. 19, and FIG. 18, the first portions 14A stacked in the first direction D1 and the sacrificial material 12 located between the adjacent first portions 14A may be patterned by using the first patterned mask layer M1 and the first opening OP1 formed in the first patterned mask layer M1 for forming a second opening OP2 penetrating through the first portions 14A and a part of the sacrificial material 12 in the first direction D1. The second opening OP2 may not penetrate through the bottommost portion of the sacrificial material 12 in the first direction D1 by controlling the etching process for forming the second opening OP2, performing a doping process to the bottommost portion of the sacrificial material 12, and/or modifying the material composition of the bottommost portion of the sacrificial material 12, and the first vertical portion P12 subsequently formed may not be directly connected with the substrate 10 accordingly.

Figure 20:
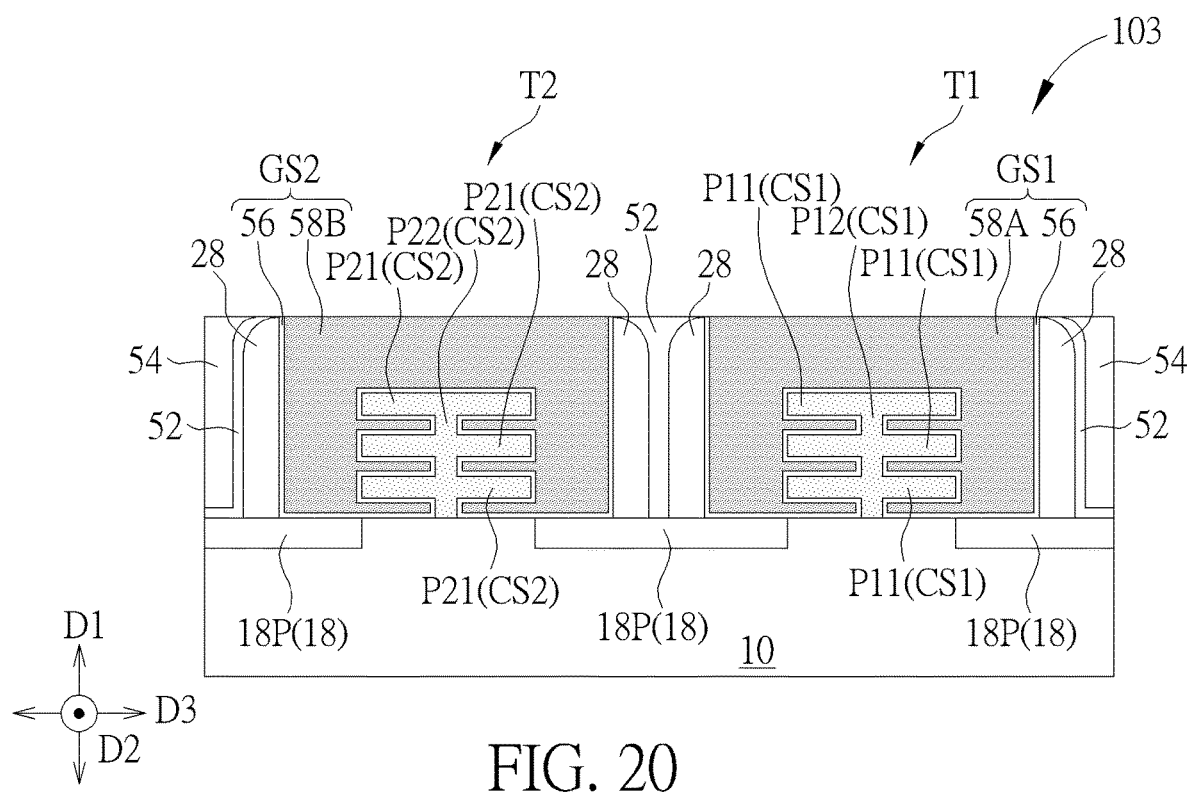
FIG. 20 is a schematic drawing illustrating a semiconductor device according to a third embodiment of the present invention.

Please refer to FIG. 20. FIG. 20 is a schematic drawing illustrating a semiconductor device 103 according to a third embodiment of the present invention. As shown in FIG. 20, in some embodiments, the second semiconductor channel structure CS2 may further include a second vertical portion P22, and the second vertical portion P22 may be elongated in the first direction D1 and connected with the second horizontal portions P21. A material composition of the second vertical portion P22 may be identical to or different from the material composition of each of the second horizontal portions P21 according to some design considerations. In the second transistor T2, the second gate structure GS2 may encompass the second vertical portion P22 and each of the second horizontal portions P21 of the second semiconductor channel structure CS2, and the second vertical portion P22 may be used to increase the total surface area of the second semiconductor channel structure CS2 covered by the second gate structure GS2 and provide more (110) lattice surfaces for enhancing the electrical performance of the second transistor T2. In some embodiments, the second vertical portion P22 may be regarded as a portion penetrating through each of the second horizontal portions P21 in the first direction D1, and at least a part of each of the second horizontal portions P21 may be disposed at two opposite sides of the second vertical portion P22 in a direction orthogonal to the first direction D1 (such as the third direction D3), but not limited thereto.

Figure 21:
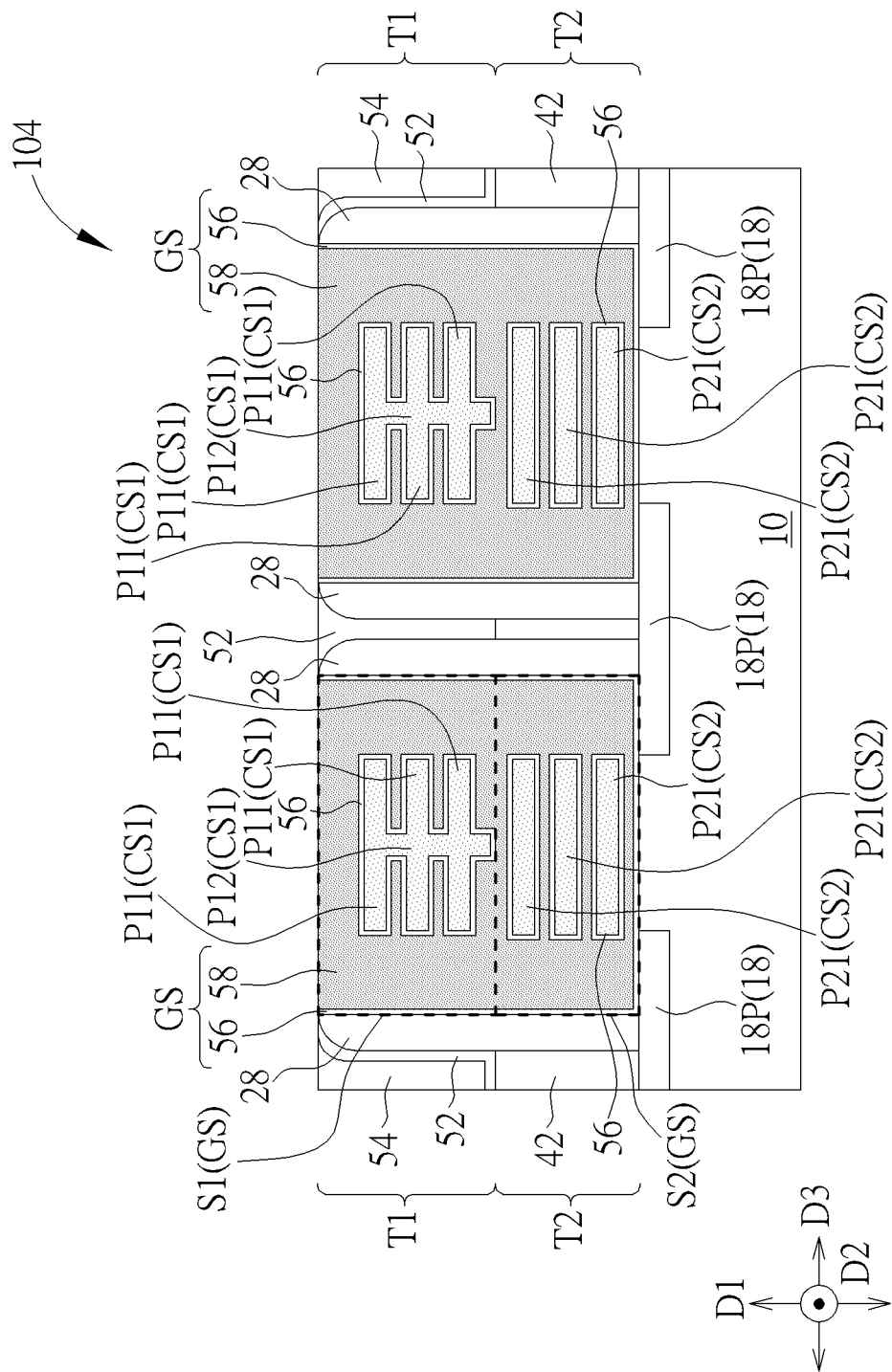
FIG. 21 is a schematic cross-sectional diagram of a semiconductor device according to a fourth embodiment of the present invention in a direction.
Figure 22:
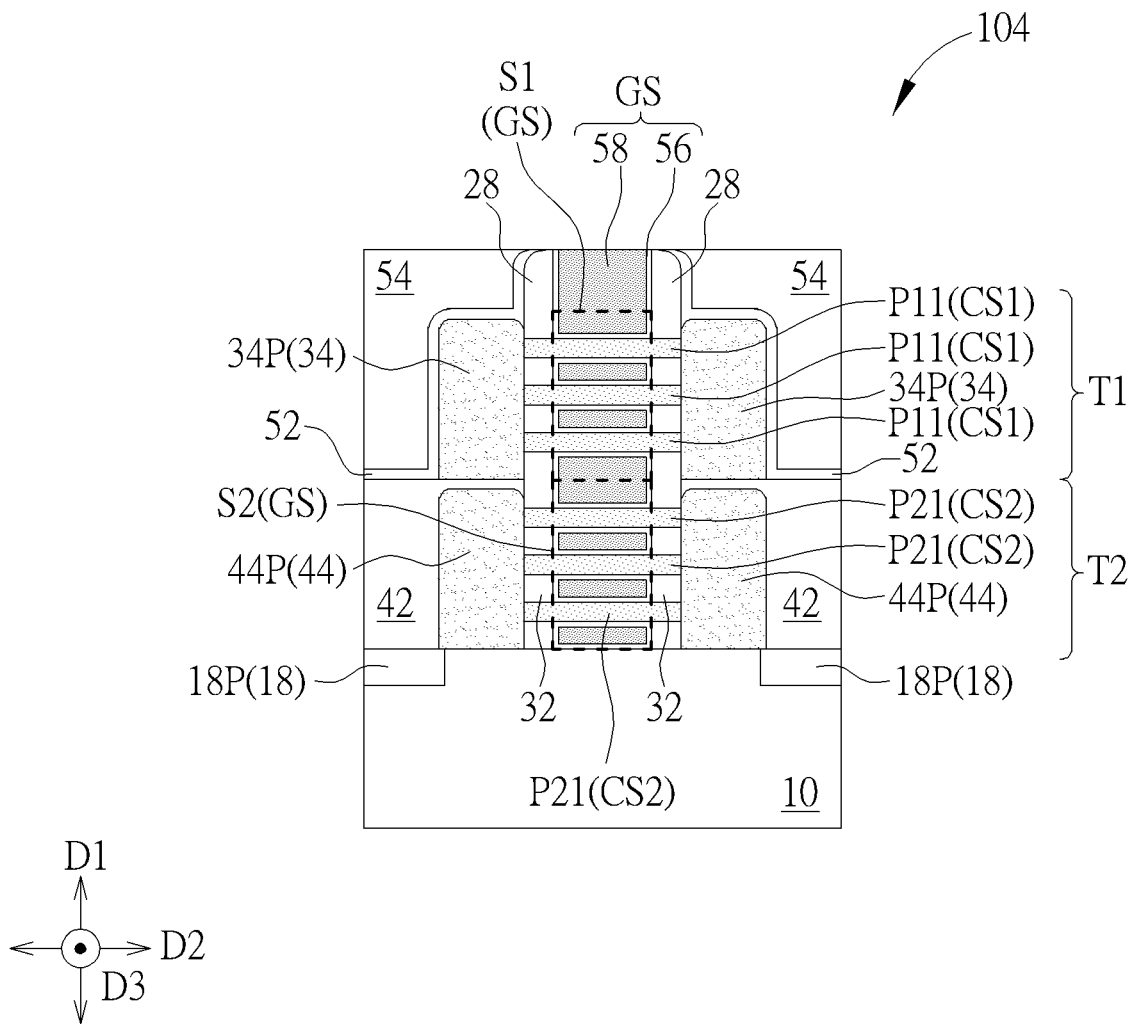
FIG. 22 is a schematic cross-sectional diagram of the semiconductor device according to the fourth embodiment of the present invention in another direction.

Please refer to FIG. 21 and FIG. 22. FIG. 21 is a schematic cross-sectional diagram of a semiconductor device 104 according to a fourth embodiment of the present invention in a horizontal direction, and FIG. 22 is a schematic cross-sectional diagram of the semiconductor device 104 of this embodiment in another horizontal direction. In some embodiments, FIG. 21 may be regarded as a cross-sectional diagram of the semiconductor device 104 taken in a plane parallel with the first direction D1 and the third direction D3, and FIG. 22 may be regarded as a cross-sectional diagram of the semiconductor device 104 taken in a plane parallel with the first direction D1 and the second direction D2. As shown in FIG. 21 and FIG. 22, in the semiconductor device 104, the second transistor T2 may be disposed between the first transistor T1 and the substrate 10 in the first direction D1.

The second gate structure of the second transistor T2 may be disposed between the first gate structure of the first transistor T1 and the substrate 10 in the first direction D1. The second semiconductor channel structure CS2 may be disposed between the first semiconductor channel structure CS1 and the substrate 10 in the first direction D1. In some embodiments, the first transistor T1 and the second transistor T2 may share the same gate structure GS for process integration and process simplification, but not limited thereto.

For example, the first transistor T1 may include a first portion S1 of a gate structure GS, and the second transistor T2 may include a second portion S2 of the gate structure GS. In other words, the first portion S1 of the gate structure GS may be regarded as the first gat structure of the first transistor T1 described above, and the second portion S2 of the gate structure GS may be regarded as the second gate structure of the second transistor T2 described above. The first portion S1 of the gate structure GS may encompass the first semiconductor channel structure CS1, and the second portion S2 of the gate structure GS may encompass the second semiconductor channel structure CS2. The first portion S1 and the second portion S2 of the gate structure GS may be directly connected with each other, and the second portion S2 of the gate structure GS may be disposed between the substrate 10 and the first portion S1 of the gate structure GS in the first direction D1. In some embodiments, the gate structure GS may include the gate dielectric layer 56 and a gate material layer 58, and the gate material layer 58 may include a non-metallic electrically conductive material (such as doped polysilicon) or a metallic electrically conductive material, such as a metal gate structure formed with a work function layer and a low electrical resistivity layer stacked with each other, but not limited thereto.

In addition, the second source/drain structure 44P of the second transistor T2 may be disposed between the substrate 10 and one of the first source/drain structures 34P of the first transistor T1 in the first direction D1, and the semiconductor device 104 may further include a dielectric layer 42 disposed between one of the two first source/drain structures 34P and one of the two second source/drain structure 44P in the first direction D1 for separating the first source/drain structures 34P from the second source/drain structure 44P. The dielectric layer 42 may include an oxide insulation material (such as silicon oxide) or other suitable insulation materials. In some embodiments, the first source/drain structure 34P and the second source/drain structure 44P at least partially overlapping each other in the first direction D1 may be electrically connected with each of other via a connection structure (not shown), or the first source/drain structure 34P may have a region without overlapping the second source/drain structure 44P for forming a corresponding contact structure (not shown) on the region, but not limited thereto. In some embodiments, the semiconductor device 104 may include a plurality of the first transistors T1 and a plurality of the second transistors T2 disposed on the substrate 10, and each of the second transistors T2 may be disposed between the substrate 10 and one of the first transistors T1 in the first direction D1. Additionally, in some embodiments, the first transistor T1 including the first semiconductor channel structure CS1 having the first vertical portion P12 may be a p-type transistor preferably, the second transistor T2 including the second semiconductor channel structure CS2 without the vertical portion may be an n-type transistor, the channel width of the p-type transistor may be increased accordingly, and the electrically performance may be enhanced by greater area of (110) lattice surface from the first vertical portion P12, but not limited thereto.

Figure 23:
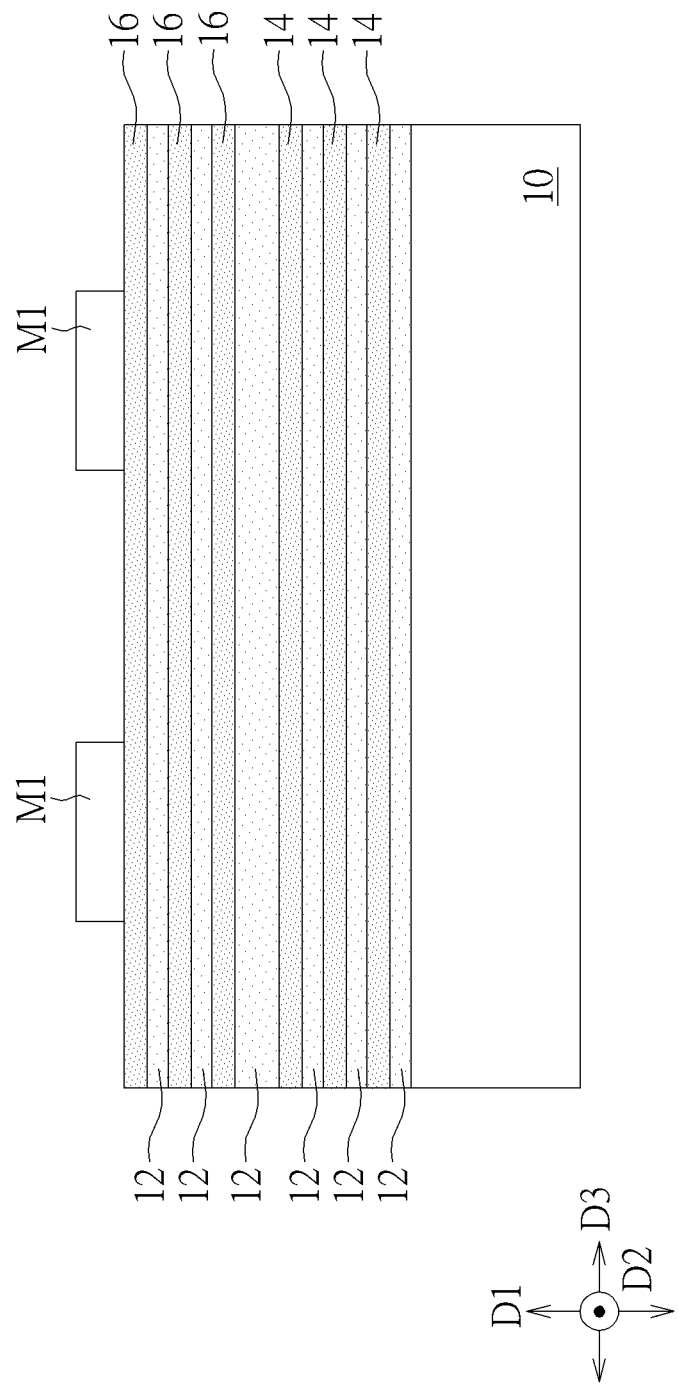
Figure 24:
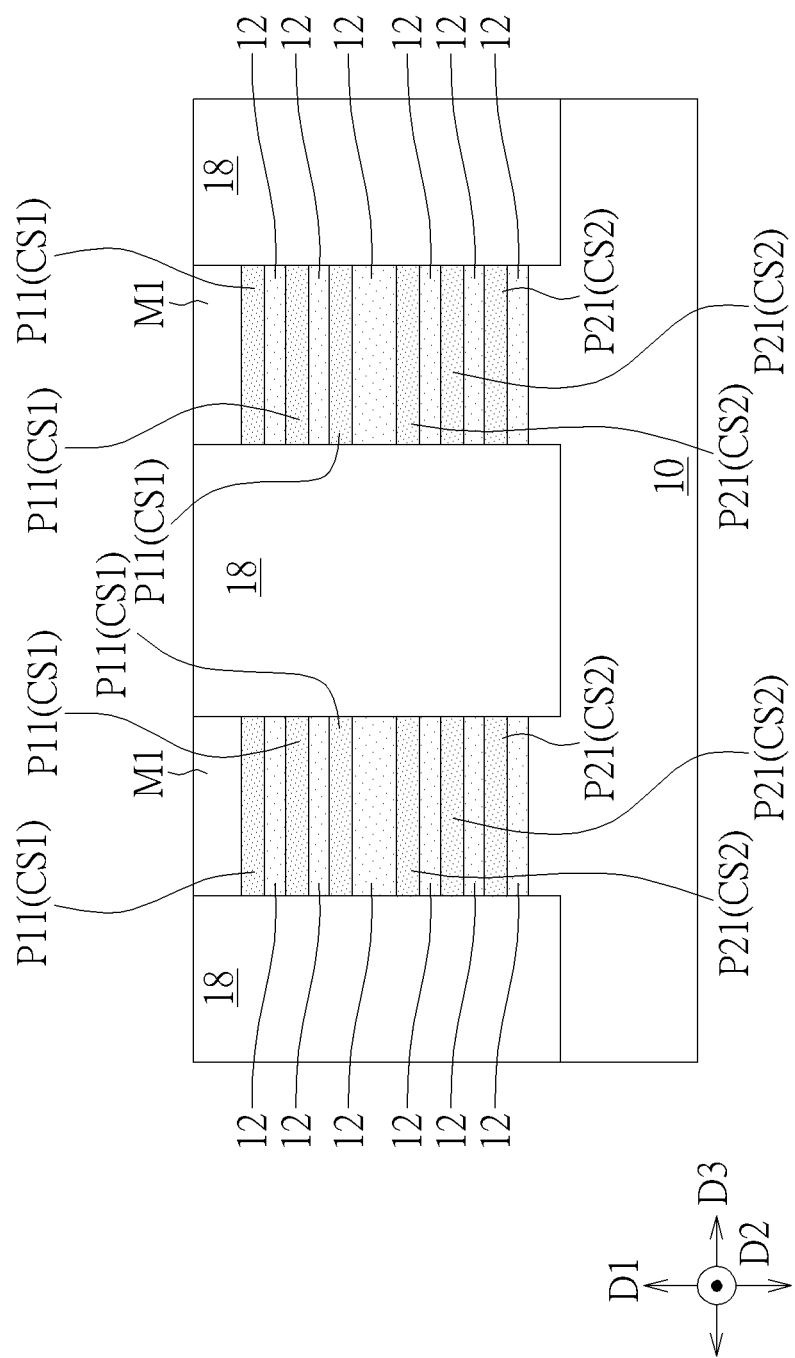
Figure 25:
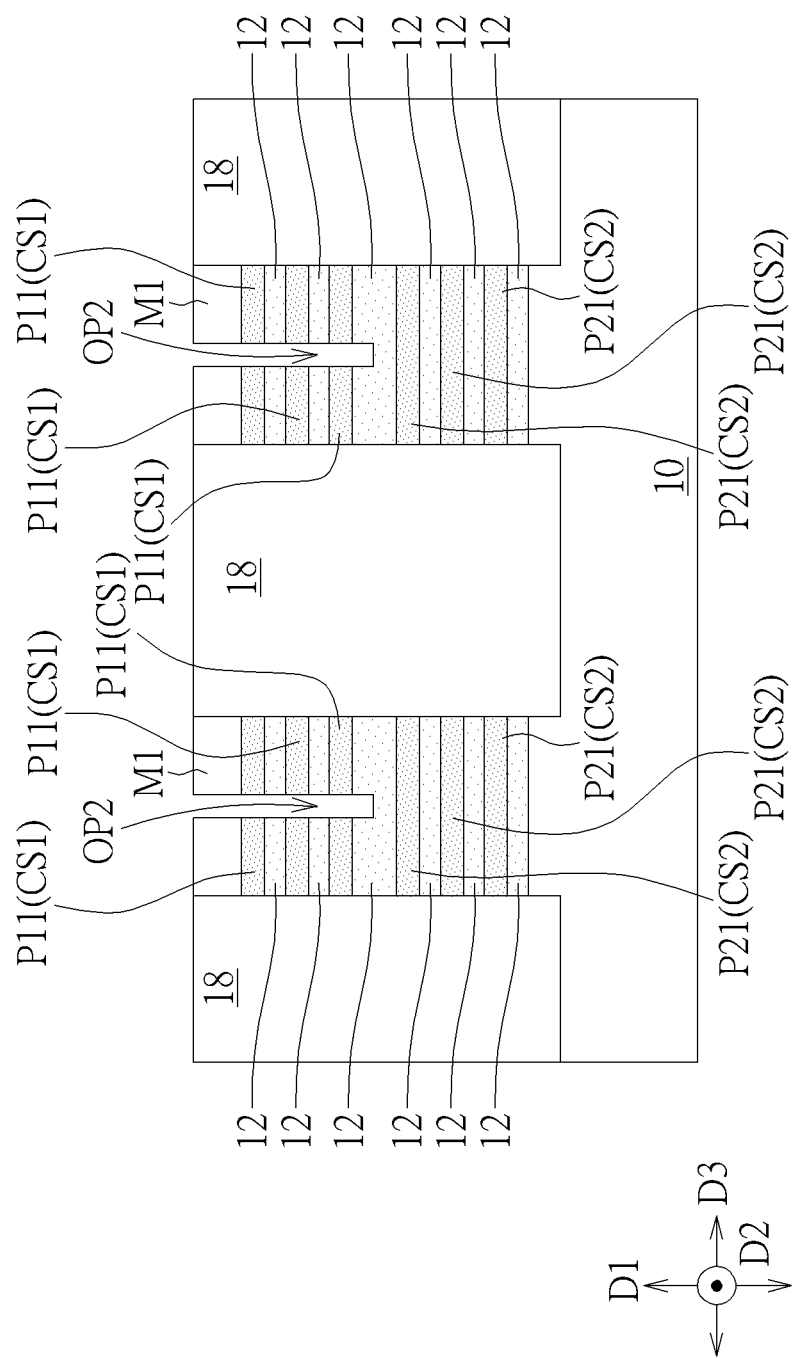
Figure 26:
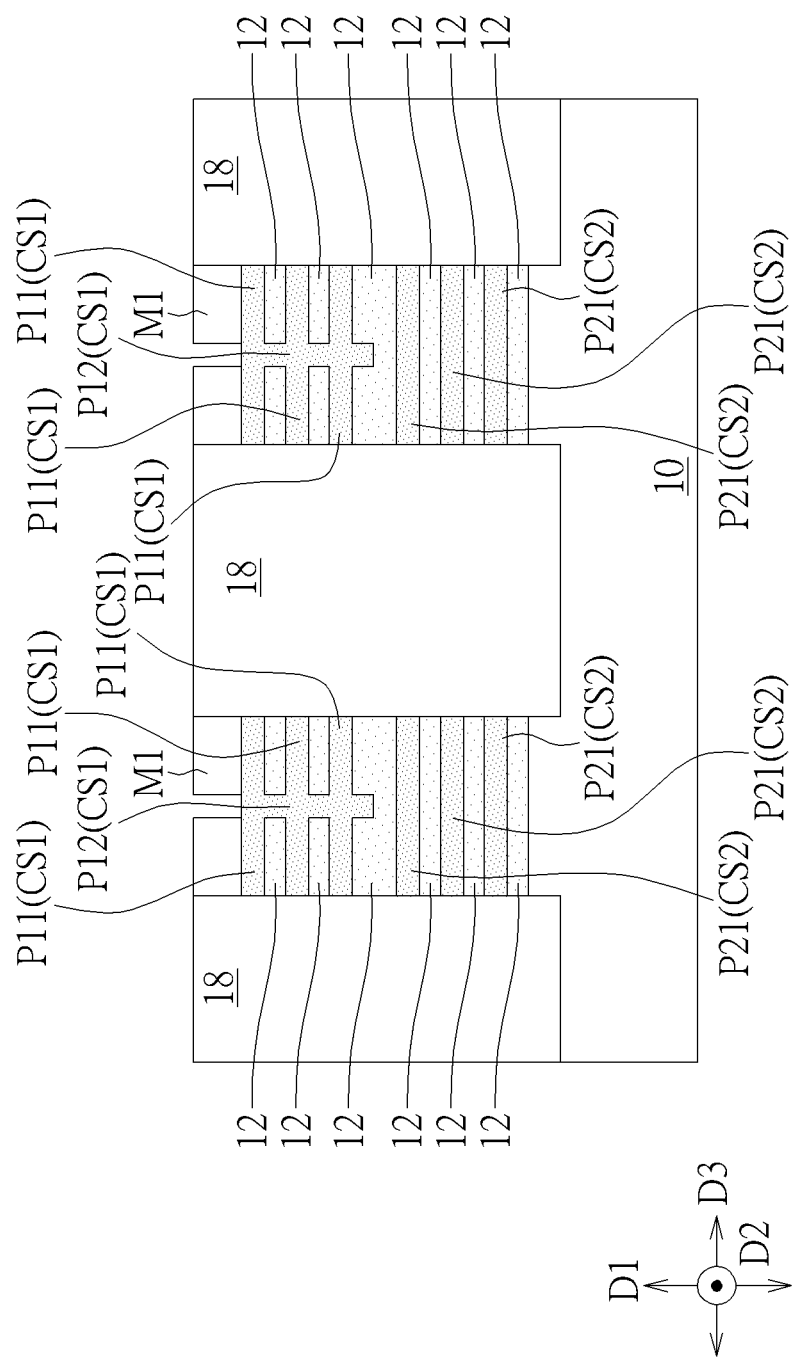
Figure 27:
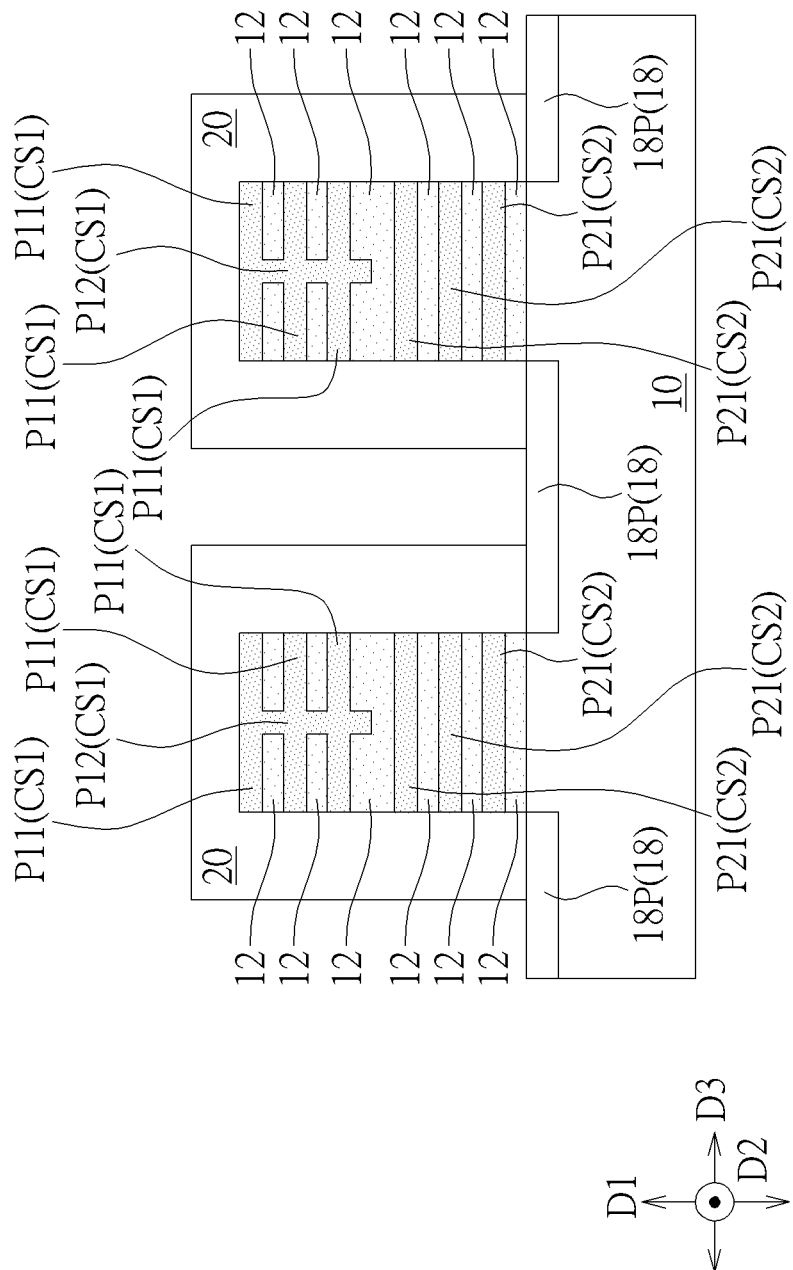
Figure 28:
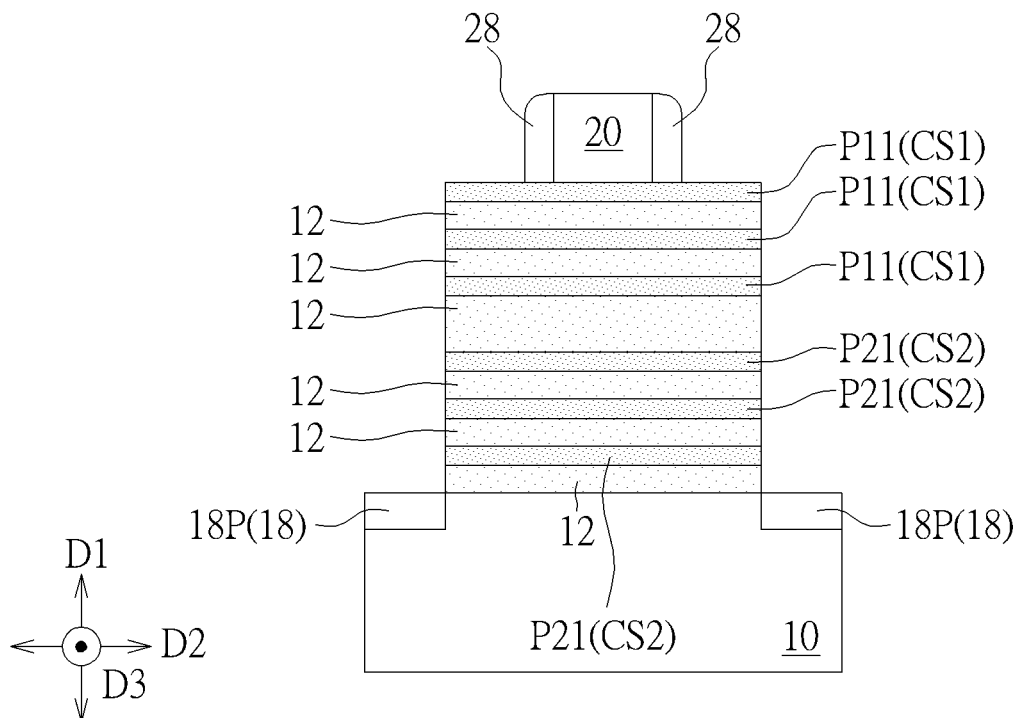
Figure 29:
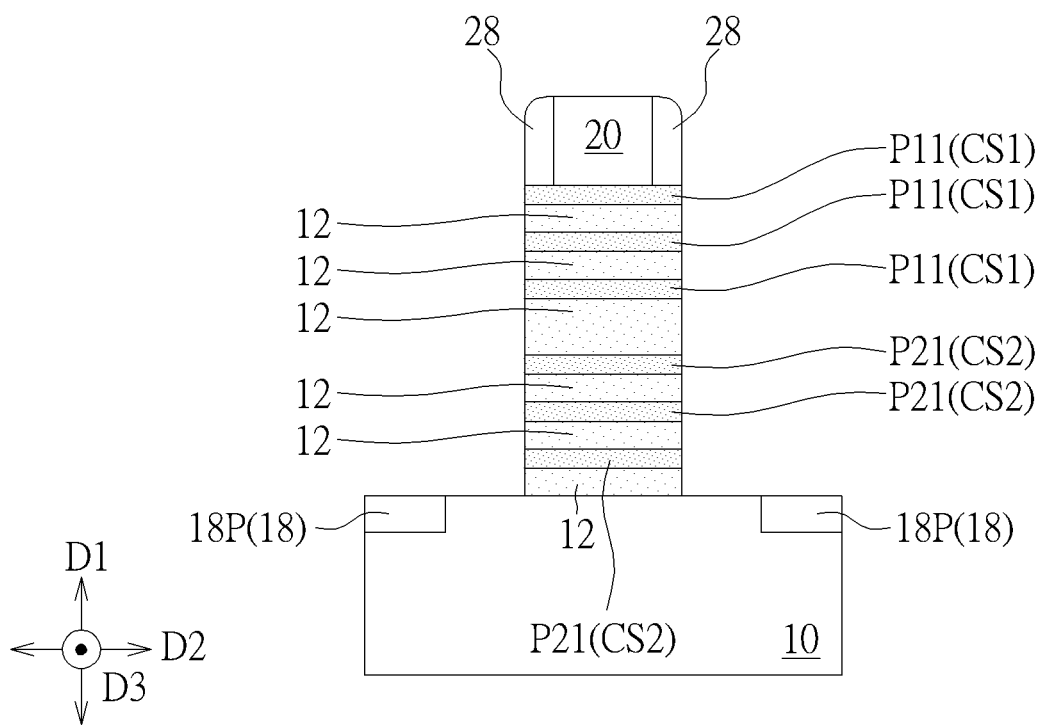
Figure 30:
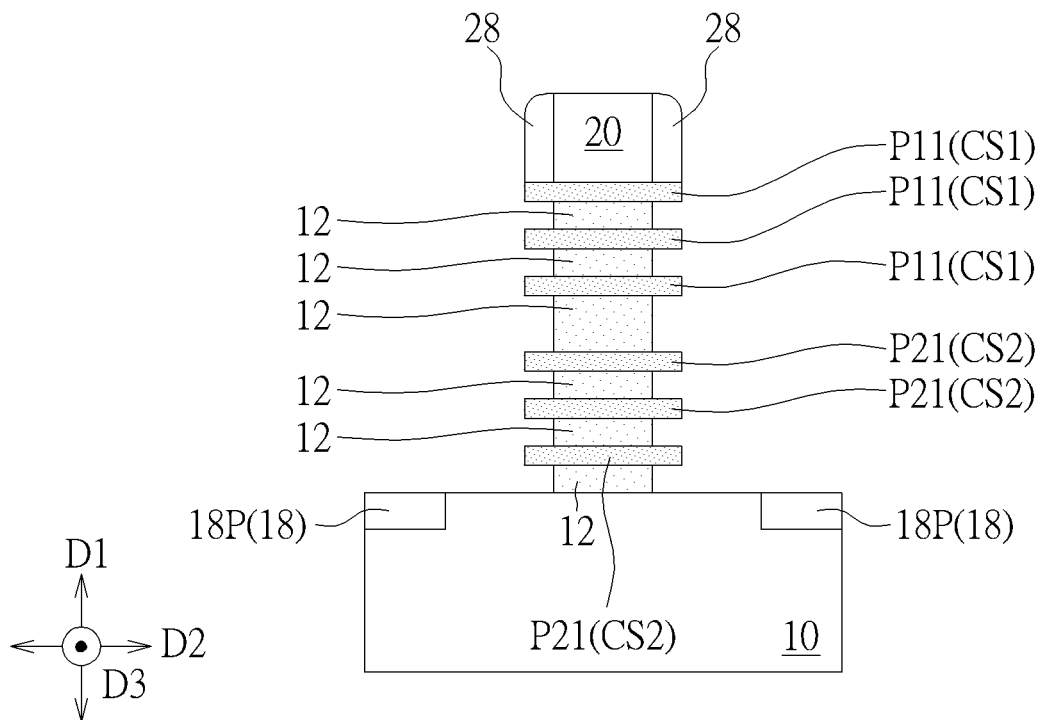
Figure 31:
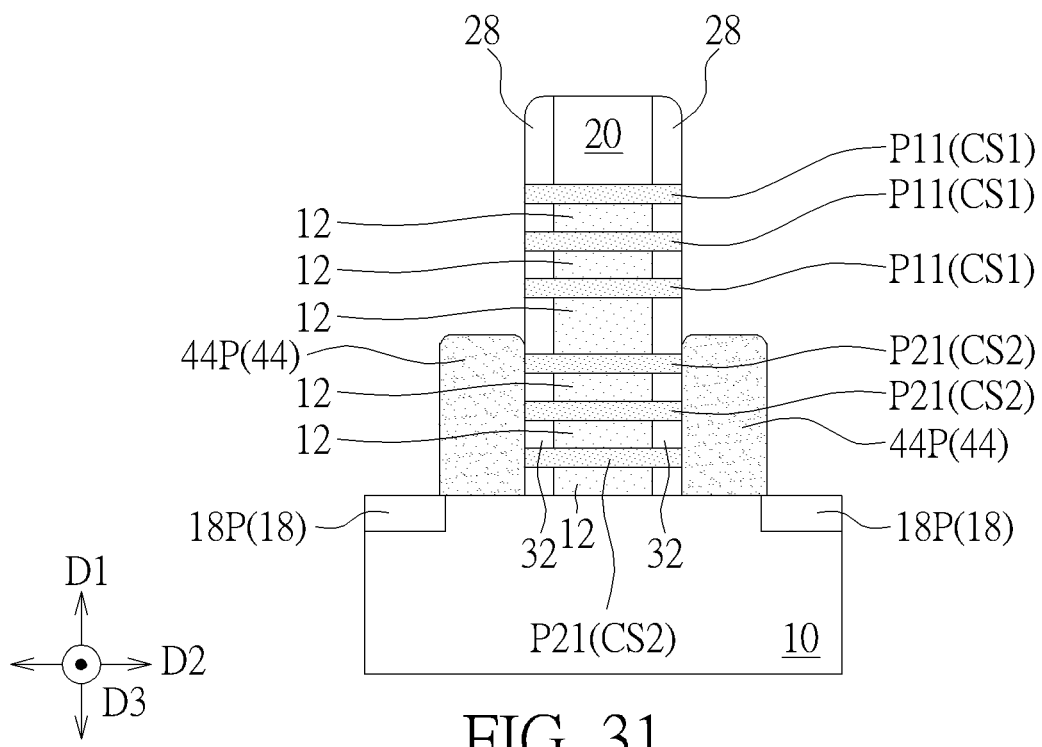
Figure 32:
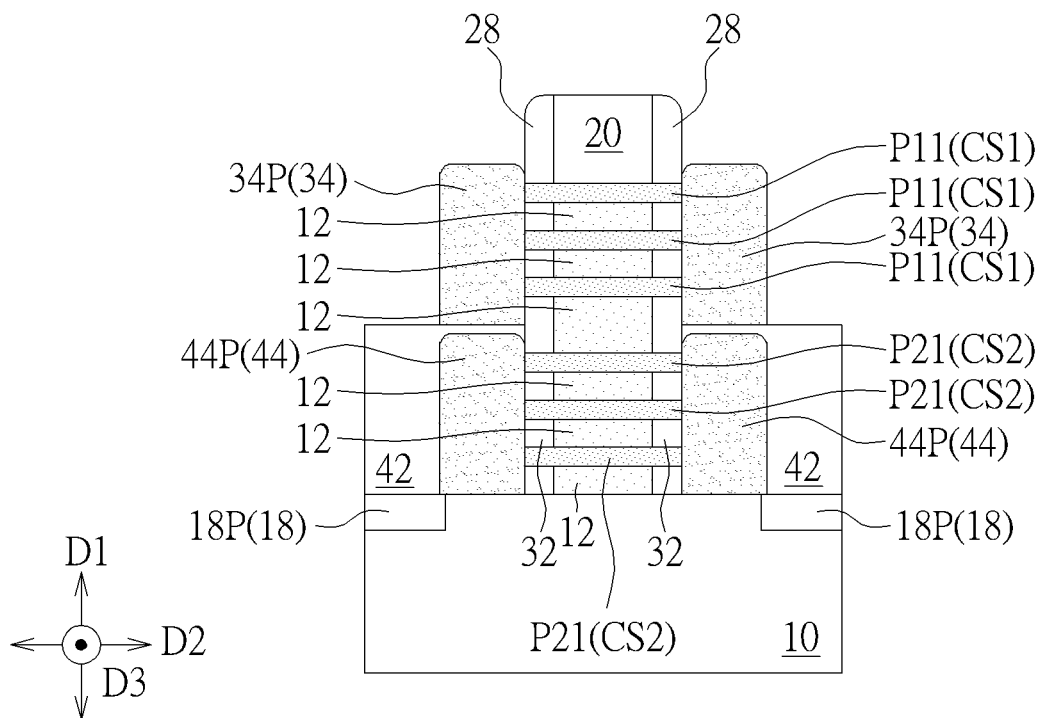
Figure 33:
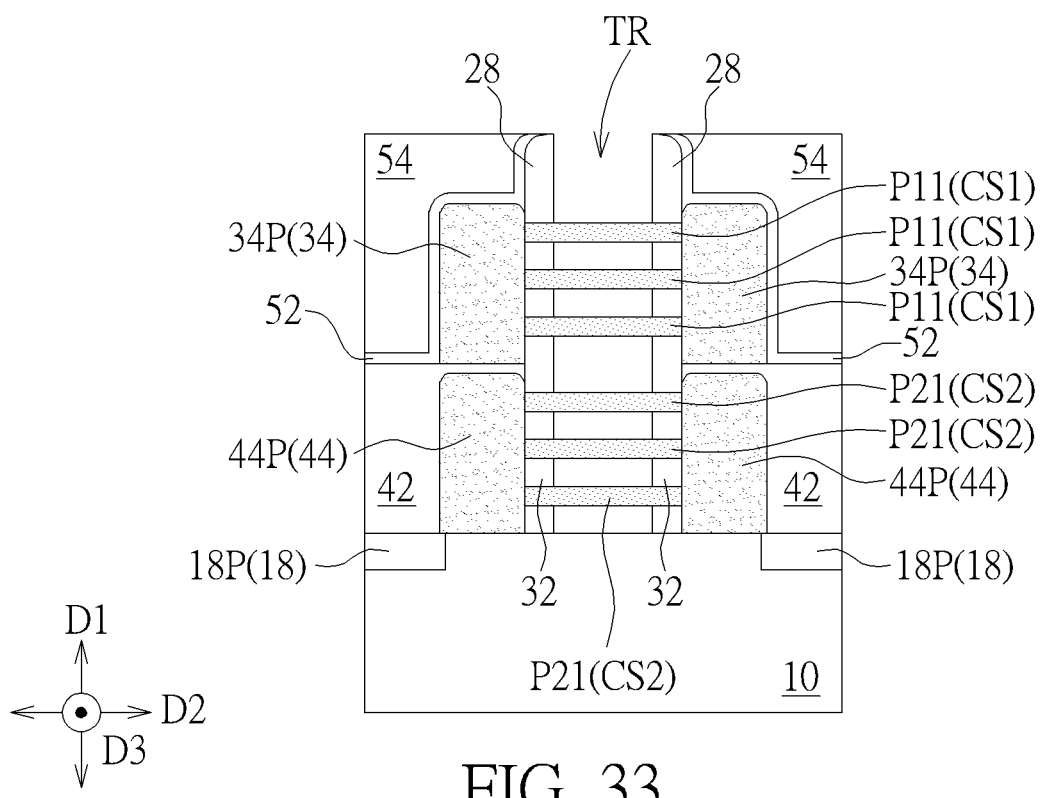

Please refer to FIGS. 21-33. FIGS. 23-33 are schematic drawings illustrating a manufacturing method of the semiconductor device according to the fourth embodiment of the present invention, wherein FIG. 24 is a schematic drawing in a step subsequent to FIG. 23, FIG. 25 is a schematic drawing in a step subsequent to FIG. 24, FIG. 26 is a schematic drawing in a step subsequent to FIG. 25, FIG. 27 is a schematic drawing in a step subsequent to FIG. 26, FIG. 28 is a schematic drawing in a step subsequent to FIG. 27, FIG. 29 is a schematic drawing in a step subsequent to FIG. 28, FIG. 30 is a schematic drawing in a step subsequent to FIG. 29, FIG. 31 is a schematic drawing in a step subsequent to FIG. 30, FIG. 32 is a schematic drawing in a step subsequent to FIG. 31, FIG. 33 is a schematic drawing in a step subsequent to FIG. 32, and FIG. 21 and FIG. 22 may be regarded as schematic drawings in a step subsequent to FIG. 33. In some embodiments, FIGS. 23-27 may be regarded as cross-sectional diagrams taken in a plane parallel with the first direction D1 and the third direction D3, and FIGS. 28-33 may be regarded as cross-sectional diagrams taken in a plane parallel with the first direction D1 and the second direction D2. The manufacturing method of the semiconductor device 104 in this embodiment may include but is not limited to the following steps. Firstly, as shown in FIG. 23, a plurality of the first semiconductor layers 14, a plurality of second semiconductor layers 16, and the sacrificial material 12 are formed on the substrate 10. The first semiconductor layers 14 may be stacked in the first direction D1, the second semiconductor layers 16 may be stacked in the first direction D1 and be disposed above the first semiconductor layers 14, and the sacrificial material 12 may be partly disposed between the first semiconductor layers 14, partly disposed between the second semiconductor layers 16, and partly disposed between the first semiconductor layers 14 and the second semiconductor layers 16. In other words, the sacrificial material 12 and the first semiconductor layers 14 may be alternately disposed on the substrate 10, and the sacrificial material 12 and the second semiconductor layers 16 may be alternately disposed on the first semiconductor layers 14. Subsequently, the first patterned mask layer M1 may be formed on the topmost second semiconductor layer 16.

In some embodiments, a material composition of the second semiconductor layers 16 (such as the semiconductor material and/or the impurities formed in the semiconductor material) may be different from the material composition of the first semiconductor layers 14 (such as the semiconductor material and/or the impurities formed in the semiconductor material) meeting the requirements of different types of transistors for semiconductor channel structures, but not limited thereto. In some embodiments, the first semiconductor layer 14 and the second semiconductor layer 16 may include the same semiconductor material with different impurities for providing the required selectivity between the sacrificial material 12, the first semiconductor layer 14, the second semiconductor layer 16, and meeting the requirements of different types of transistors for semiconductor channel structures. For example, in some embodiments, the material of the first semiconductor layer 14 and the second semiconductor layer 16 may be a silicon semiconductor material (such as epitaxial silicon), and the material of the sacrificial material 12 may be silicon germanium for constituting a superlattice epitaxial structure, but not limited thereto.

Subsequently, as shown in FIG. 23 and FIG. 24, a patterning process may be performed to the second semiconductor layers 16, the first semiconductor layers 14, the sacrificial material 12, and a part of the substrate 10 with the first patterned mask layer M1 as a mask for forming a plurality of the first horizontal portions P11 stacked in the first direction D1 and separated from one another and a plurality of second horizontal portions P21 stacked in the first direction D1 and separated from one another. In other words, at least a part of the second semiconductor layers 16 may be patterned to be the first horizontal portions P11 in the first semiconductor channel structure CS1, and at least a part of the first semiconductor layers 14 may be patterned to be the second horizontal portions P21 in the second semiconductor channel structure CS2. In addition, the isolation material 18 may be formed on the substrate 10 exposed by the patterning process described above, and a planarization process may be performed to the isolation material 18 and the first patterned mask layer M1 for making the top surface of the isolation material 18 substantially coplanar with the top surface of the first patterned mask layer M1, but not limited thereto.

As shown in FIG. 25 and FIG. 26, the second opening OP2 penetrating through each of the first horizontal portions P11 and a part of the sacrificial material 12 may be formed, and the first vertical portion P12 of the first semiconductor channel structure CS1 may be formed in the second opening OP2. As shown in FIG. 26 and FIG. 27, after the step of forming the first vertical portion P12, an etching back process may be performed to the isolation material 18 for forming the isolation structure 18P in the substrate 10, and the first patterned mask layer M1 may be removed. Subsequently, the dummy gate structures 20 may be formed on the first semiconductor channel structure CS1 and the second semiconductor channel structure CS2 respectively. The dummy gate structures 20 may be disposed straddling two opposite sides of the first semiconductor channel structure CS1 in the third direction D3 and two opposite sides of the second semiconductor channel structure CS2 in the third direction D3, but not limited thereto. As shown in FIG. 28 and FIG. 29, the spacer 28 may be formed on sidewalls of the dummy gate structures 20, and a patterning process may be performed to the first semiconductor channel structure CS1, the second semiconductor channel structure CS2, and the sacrificial material 12 with the dummy gate structure 20 and the spacer 28 as a mask for removing a part of the sacrificial material 12, a part of each of the first horizontal portions P11, and a part of each of the second horizontal portions P21. As shown in FIG. 29 and FIG. 30, a recessing process may be performed to the sacrificial material 12 for reducing the length of the sacrificial material 12 in the second direction D2 and further exposing a part of each of the first horizontal portions P11 and a part of each of the second horizontal portions P21.

As shown in FIG. 30 and FIG. 31, the spacer 32 may then be formed on the sidewalls of the sacrificial material 12, and the second epitaxial material 44 may be formed on the substrate 10 after the step of forming the spacer 32. In some embodiments, an epitaxial growth process may be carried out from the substrate 10, an edge of each of the second horizontal portions P21, and/or an edge of each of the first horizontal portions P11 for forming the second epitaxial material 44, and the second epitaxial material 44 may be directly connected with each of the second horizontal portions P21. In addition, a recessing process may be performed to the second epitaxial material 44 for removing a part of the second epitaxial material 44 in order to partially expose side surfaces of each of the first horizontal portions P11 and form the second source/drain structures 44P with the second epitaxial material 44 remaining on the substrate 10. Additionally, the method of forming the second source/drain structures 44P in this embodiment may include but is not limited to the steps described above. In some embodiments, the second source/drain structures 44P may be formed by other suitable approaches according to some process and/or design considerations. For example, the dimension of the second epitaxial material 44 at the time of formation may be controlled for directly forming the second source/drain structures 44P without performing the recessing process described above, but not limited thereto.

Subsequently, as shown in FIG. 32, the dielectric layer 42 may be formed on the second source/drain structures 44P, and the first source/drain structures 34P may be formed on the dielectric layer 42. In some embodiments, the first epitaxial material 34 may be formed by performing an epitaxial growth process from the exposed edges of each of the first horizontal portions P11, and the first epitaxial material 34 may be directly connected with the first horizontal portions P11 accordingly. The first source/drain structures 34P may be formed at two opposite sides of each of the first horizontal portions P11 in the second direction D2 by controlling the formation of the first epitaxial material 34 (such as controlling the process time for forming the first epitaxial material 34). In some embodiments, a portion of the second source/drain structure 44P may not overlap the first source/drain structure 34P in the first direction D1 by removing a part of the first source/drain structure 34P, and the space for forming the contact structure corresponding to the second source/drain structure 44P may be generated accordingly, but not limited thereto.

As shown in FIG. 32, FIG. 33, and FIG. 22, in some embodiments, the gate structure GS may be formed by replacing the dummy gate structures 20 and the sacrificial material 12 with the gate dielectric layer 56 and the gate material layer 58. Specifically, as shown in FIG. 32 and FIG. 33, the etching stop layer 52 and the dielectric layer 54 may be formed after the step of forming the first source/drain structures 34P, and a planarization process may be performed for removing a part of the dummy gate structure (such as the gate cap layer), a part of the dielectric layer 54, and a part of the etching stop layer 52 and exposing the dummy gate structure 20. After the planarization process, the exposed dummy gate structure 20 and the sacrificial material 12 may be removed for forming the trench TR. The trench TR may be surrounded by the spacer 28 and the spacer 32 in the horizontal directions, and each of the first horizontal portions P11 and each of the second horizontal portions P21 may be partly disposed in the trench TR. Subsequently, as shown in FIG. 33 and FIG. 22, the gate dielectric layer 56 and the gate material layer 58 may be formed sequentially, and the trench TR may be filled with at least a part of the gate dielectric layer 56 and at least a part of the gate material layer 58. In some embodiments, another planarization process may then be performed for removing the gate dielectric layer 56 and the gate material layer 58 outside the trench TR and forming the gate structure GS in the trench TR. The method of forming the gate structure GS in this embodiment may include but is not limited to the steps described above. In some embodiments, the gate structure GS may be formed by other suitable approaches according to some process and/or design considerations.

Figure 34:
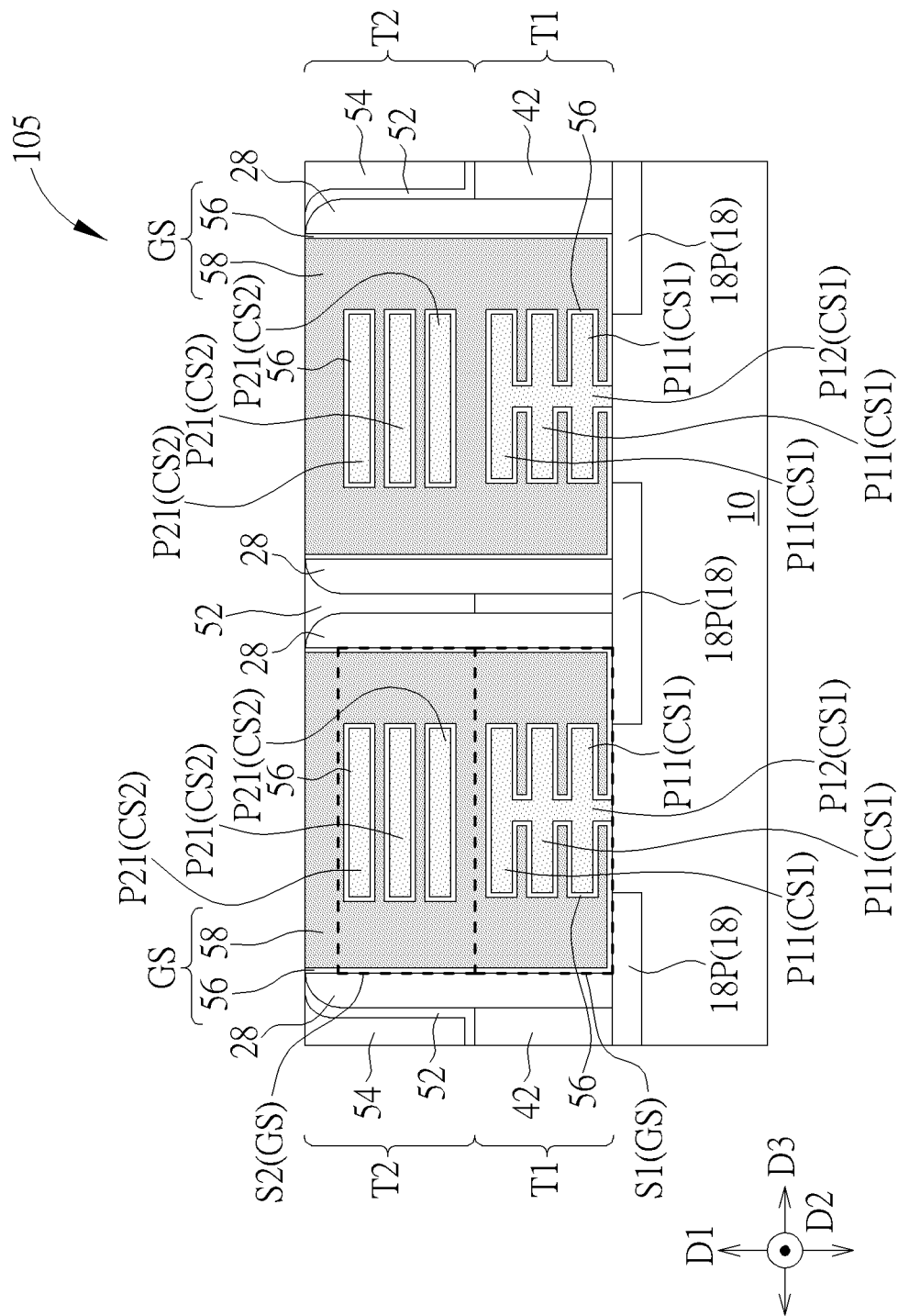
FIG. 34 is a schematic drawing illustrating a semiconductor device according to a fifth embodiment of the present invention.

Please refer to FIG. 34. FIG. 34 is a schematic drawing illustrating a semiconductor device 105 according to a fifth embodiment of the present invention. As shown in FIG. 34, in the semiconductor device 105, the first transistor T1 including the first semiconductor channel structure CS1 having the first horizontal portions P11 and the first vertical portion P12 may be disposed between the second transistor T2 including the second semiconductor channel structure CS2 having the second horizontal portions P21 without the vertical portion and the substrate 10 in the first direction D1. In addition, the first gate structure of the first transistor T1 may be disposed between the second gate structure of the second transistor T2 and the substrate 10 in the first direction D1, and the first semiconductor channel structure CS1 may be disposed between the second semiconductor channel structure CS2 and the substrate 10 in the first direction D1. In some embodiments, the first transistor T1 and the second transistor T2 may share one gate structure GS for process integration and process simplification, but not limited thereto. For example, the first transistor T1 may include the first portion S1 of the gate structure GS and the second transistor T2 may include the second portion S2 of the gate structure GS, the first portion S1 of the gate structure GS may be regarded as the first gate structure of the first transistor T1 described above, and the second portion S2 of the gate structure GS may be regarded as the second gate structure of the second transistor T2 described above, but not limited thereto.

Figure 35:
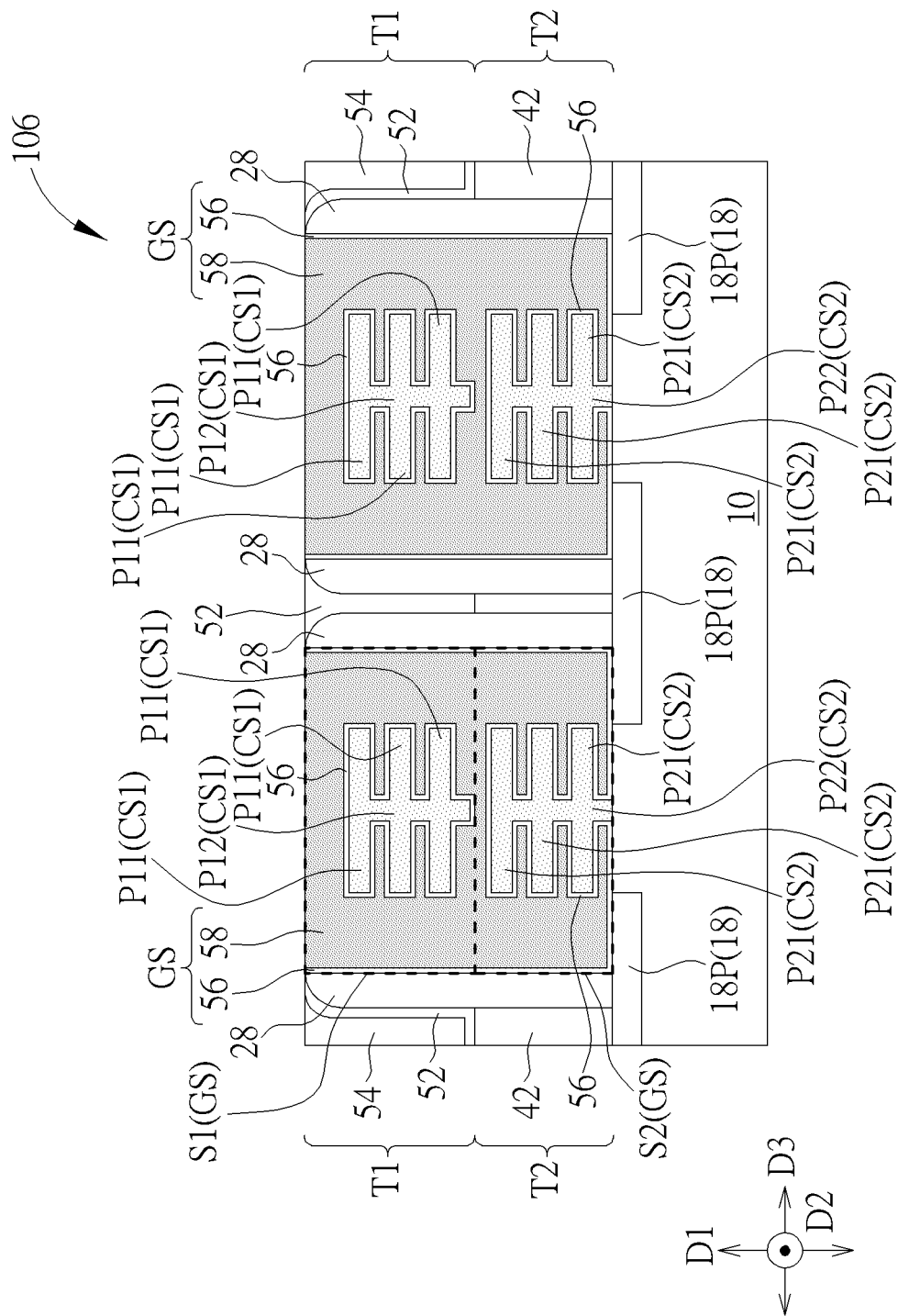
FIG. 35 is a schematic drawing illustrating a semiconductor device according to a sixth embodiment of the present invention.

Please refer to FIG. 35. FIG. 35 is a schematic drawing illustrating a semiconductor device 106 according to a sixth embodiment of the present invention. As shown in FIG. 35, in the semiconductor device 106, the first semiconductor channel structure CS1 of the first transistor T1 may include the first horizontal portions P11 and the first vertical portion P12 described above, and the second semiconductor channel structure CS2 of the second transistor T2 may include the second horizontal portions P21 and the second vertical portion P22 described above. Additionally, the first transistor T1 and the second transistor T2 may be stacked on the substrate 10 in the first direction D1, and the first transistor T1 and the second transistor T2 may share one gate structure GS for process integration and process simplification, but not limited thereto.

To summarize the above descriptions, in the semiconductor device and the manufacturing method thereof in the present invention, the surface characteristics of the semiconductor channel structure may be modified by the vertical portion connected with the horizontal portions in the semiconductor channel structure. The surface area of the semiconductor channel structure covered by the gate structure may be increased and/or the carrier mobility may be enhanced by the lateral lattice plane provided by the vertical portion, and the electrical performance of the semiconductor device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   forming a first transistor on a substrate, wherein the first transistor comprises:
      a first semiconductor channel structure, wherein the first semiconductor channel structure comprises:
         first horizontal portions stacked in a vertical direction and separated from one another, wherein each of the first horizontal portions is elongated in a horizontal direction; and
         a first vertical portion elongated in the vertical direction and connected with the first horizontal portions;
      two first source/drain structures disposed at two opposite sides of each of the first horizontal portions in the horizontal direction respectively, wherein the two first source/drain structures are connected with the first horizontal portions; and
      a first gate structure encompassing the first horizontal portions and the first vertical portion of the first semiconductor channel structure, wherein a part of the first gate structure is disposed between the first vertical portion of the first semiconductor channel structure and the substrate in the vertical direction.

2. The manufacturing method of the semiconductor device according to claim 1, wherein the first vertical portion is formed after the first horizontal portions are formed, and the first vertical portion is formed in an opening penetrating through the first horizontal portions in the vertical direction.

3. The manufacturing method of the semiconductor device according to claim 2, wherein a bottom surface of the opening in the vertical direction and a bottom surface of one of the first horizontal portions in the vertical direction are coplanar.

4. The manufacturing method of the semiconductor device according to claim 3, wherein a bottom surface of the first vertical portion in the vertical direction and a bottom surface of one of the first horizontal portions in the vertical direction are coplanar.

5. The manufacturing method of the semiconductor device according to claim 1, wherein a top surface of the first vertical portion in the vertical direction and a top surface of one of the first horizontal portions in the vertical direction are coplanar.

6. The manufacturing method of the semiconductor device according to claim 1, wherein a material composition of the first vertical portion is identical to a material composition of each of the first horizontal portions.

7. The manufacturing method of the semiconductor device according to claim 1, wherein a material composition of the first vertical portion is different from a material composition of each of the first horizontal portions.

8. The manufacturing method of the semiconductor device according to claim 1, wherein the first vertical portion is directly connected with each of the first horizontal portions.

9. The manufacturing method of the semiconductor device according to claim 1, wherein the first gate structure is formed after the first semiconductor channel structure and the two first source/drain structures are formed.

10. The manufacturing method of the semiconductor device according to claim 1, further comprising:
    forming a second transistor on the substrate, wherein the second transistor comprises:
       a second semiconductor channel structure, wherein the second semiconductor channel structure comprises:
          second horizontal portions stacked in the vertical direction and separated from one another, wherein each of the second horizontal portions is elongated in the horizontal direction; and
       two second source/drain structures disposed at two opposite sides of each of the second horizontal portions in the horizontal direction respectively, wherein the two second source/drain structures are connected with the second horizontal portions.

11. The manufacturing method of the semiconductor device according to claim 10, wherein the first horizontal portions of the first semiconductor channel structure and the second horizontal portions of the second semiconductor channel structure are formed by different patterning processes.

12. The manufacturing method of the semiconductor device according to claim 10, wherein a material composition of each of the second horizontal portions of the second semiconductor channel structure is different from the material composition of each of the first horizontal portions of the first semiconductor channel structure.

13. The manufacturing method of the semiconductor device according to claim 10, wherein a conductivity type of the second semiconductor channel structure is complementary to a conductivity type of the first semiconductor channel structure.

14. The manufacturing method of the semiconductor device according to claim 10, wherein the second transistor further comprises a second gate structure encompassing the second semiconductor channel structure.

15. The manufacturing method of the semiconductor device according to claim 14, wherein the first gate structure and the second gate structure are separated from each other, and a material composition of the first gate structure is different from a material composition of the second gate structure.

16. The manufacturing method of the semiconductor device according to claim 14, wherein the first gate structure and the second gate structure are directly connected with each other.

17. The manufacturing method of the semiconductor device according to claim 10, wherein the second semiconductor channel structure further comprises:
a second vertical portion elongated in the vertical direction and connected with the second horizontal portions, wherein a material composition of the second vertical portion is different from a material composition of each of the second horizontal portions.

* * * * *